(12) United States Patent
Kang et al.

(10) Patent No.: US 11,769,726 B2
(45) Date of Patent: Sep. 26, 2023

(54) SEMICONDUCTOR DEVICE

(71) Applicant: Samsung Electronics Co., Ltd., Suwon-si (KR)

(72) Inventors: Byounggon Kang, Seoul (KR); Changbeom Kim, Tongyeong-si (KR); Dalhee Lee, Seoul (KR); Eun-Hee Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/744,375

(22) Filed: May 13, 2022

(65) Prior Publication Data

US 2022/0270965 A1    Aug. 25, 2022

Related U.S. Application Data

(63) Continuation of application No. 16/919,670, filed on Jul. 2, 2020, now Pat. No. 11,362,032.

(30) Foreign Application Priority Data

Aug. 1, 2019  (KR) .......................... 10-2019-0094008
Aug. 9, 2019  (KR) .......................... 10-2019-0097258
Jan. 20, 2020 (KR) .......................... 10-2020-0007423

(51) Int. Cl.
*H01L 21/00* (2006.01)
*H01L 23/528* (2006.01)
(Continued)

(52) U.S. Cl.
CPC ........ *H01L 23/528* (2013.01); *H01L 23/5226* (2013.01); *H01L 27/0207* (2013.01);
(Continued)

(58) Field of Classification Search
CPC ............... H01L 23/528; H01L 23/5226; H01L 27/0207
See application file for complete search history.

(56) References Cited

U.S. PATENT DOCUMENTS 9,595,582 B2 *  3/2017  Lee ................... H01L 29/41775
9,865,544 B2    1/2018  Jung
(Continued)

FOREIGN PATENT DOCUMENTS

CN    105489643 A *  4/2016 ..... H01L 21/823431
CN    105489643 A     4/2016
(Continued)

OTHER PUBLICATIONS

H. Aikawa et al., Variability Aware Modeling and Characterization in Standard Cell in 45 nm CMOS with Stress Enhancement Technique, IEEE 2008 Symposium on VLSI Technology Digest of Technical Papers.
(Continued)

*Primary Examiner* — Laura M Menz
(74) *Attorney, Agent, or Firm* — Muir Patent Law, PLLC

(57) ABSTRACT

A semiconductor device includes a first gate electrode disposed on a substrate and extending in a first horizontal direction, a first gate contact and a dummy gate contact, which are spaced apart from each other in the first horizontal direction and are in contact with a top surface of the first gate electrode, a first interconnect line extending in a second horizontal direction and overlapping the first gate contact in a vertical direction with respect to the upper surface of the substrate, and a voltage generator configured to generate a first voltage and apply the first voltage to the first gate electrode via the first interconnect line and the first gate contact. The first gate electrode receives the first voltage via the first interconnect line and the first gate contact from the (Continued)

voltage generator. The dummy gate contact receives the first voltage via the first gate electrode.

20 Claims, 28 Drawing Sheets

(51) Int. Cl.
- *H01L 23/522* (2006.01)
- *H01L 29/78* (2006.01)
- *H01L 27/092* (2006.01)
- *H01L 27/02* (2006.01)
- *H01L 27/118* (2006.01)
- *H01L 29/423* (2006.01)

(52) U.S. Cl.
CPC ........ *H01L 27/092* (2013.01); *H01L 27/0924* (2013.01); *H01L 27/11807* (2013.01); *H01L 29/7853* (2013.01); *H01L 29/42392* (2013.01); *H01L 2027/11864* (2013.01); *H01L 2027/11866* (2013.01)

(56) References Cited

U.S. PATENT DOCUMENTS

| | | | |
|---|---|---|---|
| 9,947,589 B1 | 4/2018 | Park et al. | |
| 10,553,598 B2* | 2/2020 | Jung | H10B 41/27 |
| 10,923,489 B2* | 2/2021 | Jung | H10B 41/35 |
| 11,362,032 B2* | 6/2022 | Kang | H01L 23/5226 |
| 2002/0153537 A1* | 10/2002 | Segawa | H01L 21/76897 |
| | | | 257/E21.507 |
| 2003/0211716 A1* | 11/2003 | Segawa | H01L 21/3003 |
| | | | 257/E21.507 |
| 2010/0259296 A1* | 10/2010 | Or-Bach | H03K 19/17748 |
| | | | 326/38 |
| 2010/0295136 A1* | 11/2010 | Or-Bach | H01L 21/76254 |
| | | | 257/390 |
| 2011/0049577 A1* | 3/2011 | Or-Bach | H01L 21/8221 |
| | | | 257/209 |
| 2011/0084314 A1* | 4/2011 | Or-Bach | H01L 29/808 |
| | | | 257/209 |
| 2011/0233676 A1* | 9/2011 | Or-Bach | H01L 23/36 |
| | | | 257/347 |
| 2012/0129301 A1* | 5/2012 | Or-Bach | H01L 29/66833 |
| | | | 438/129 |
| 2015/0372085 A1* | 12/2015 | Lee | H01L 29/4238 |
| | | | 257/288 |
| 2016/0307837 A1* | 10/2016 | Park | H01L 23/485 |
| 2017/0098608 A1* | 4/2017 | Jung | H01L 23/50 |
| 2018/0032658 A1 | 2/2018 | Ha et al. | |
| 2018/0096092 A1 | 4/2018 | Kim et al. | |
| 2019/0035692 A1 | 1/2019 | Xie et al. | |
| 2019/0148407 A1 | 5/2019 | Guo et al. | |
| 2019/0157282 A1* | 5/2019 | Jung | H10B 43/27 |
| 2020/0135711 A1* | 4/2020 | Do | H01L 23/5228 |
| 2020/0168621 A1* | 5/2020 | Jung | H10B 43/10 |
| 2020/0176033 A1* | 6/2020 | Hosotani | H01L 23/481 |
| 2020/0176470 A1* | 6/2020 | Gu | H10B 41/50 |
| 2020/0286828 A1* | 9/2020 | Hosotani | H10B 41/10 |
| 2021/0035902 A1* | 2/2021 | Kang | H01L 27/092 |
| 2021/0231727 A1* | 7/2021 | Park | G01R 31/2621 |
| 2022/0270965 A1* | 8/2022 | Kang | H01L 29/7853 |
| 2023/0027769 A1* | 1/2023 | Park | H01L 29/41775 |

FOREIGN PATENT DOCUMENTS

| | | | | |
|---|---|---|---|---|
| CN | 107039417 A | * | 8/2017 | ....... H01L 21/32139 |
| CN | 107039417 A | | 8/2017 | |
| CN | 112310224 A | * | 2/2021 | ......... H01L 21/8238 |
| CN | 112310224 A | | 2/2021 | |
| CN | 113782539 A | * | 12/2021 | ....... H01L 27/11519 |
| KR | 1020180013661 A | | 2/2018 | |
| WO | WO-2021194981 A1 | * | 9/2021 | ....... H01L 21/82385 |

OTHER PUBLICATIONS

Sun Ik Heo et al., Diffusion Break-Aware Leakage Power Optimization and Detailed Placement in Sub-10nm VLSI, 2019 Association for Computing Machinery.

* cited by examiner

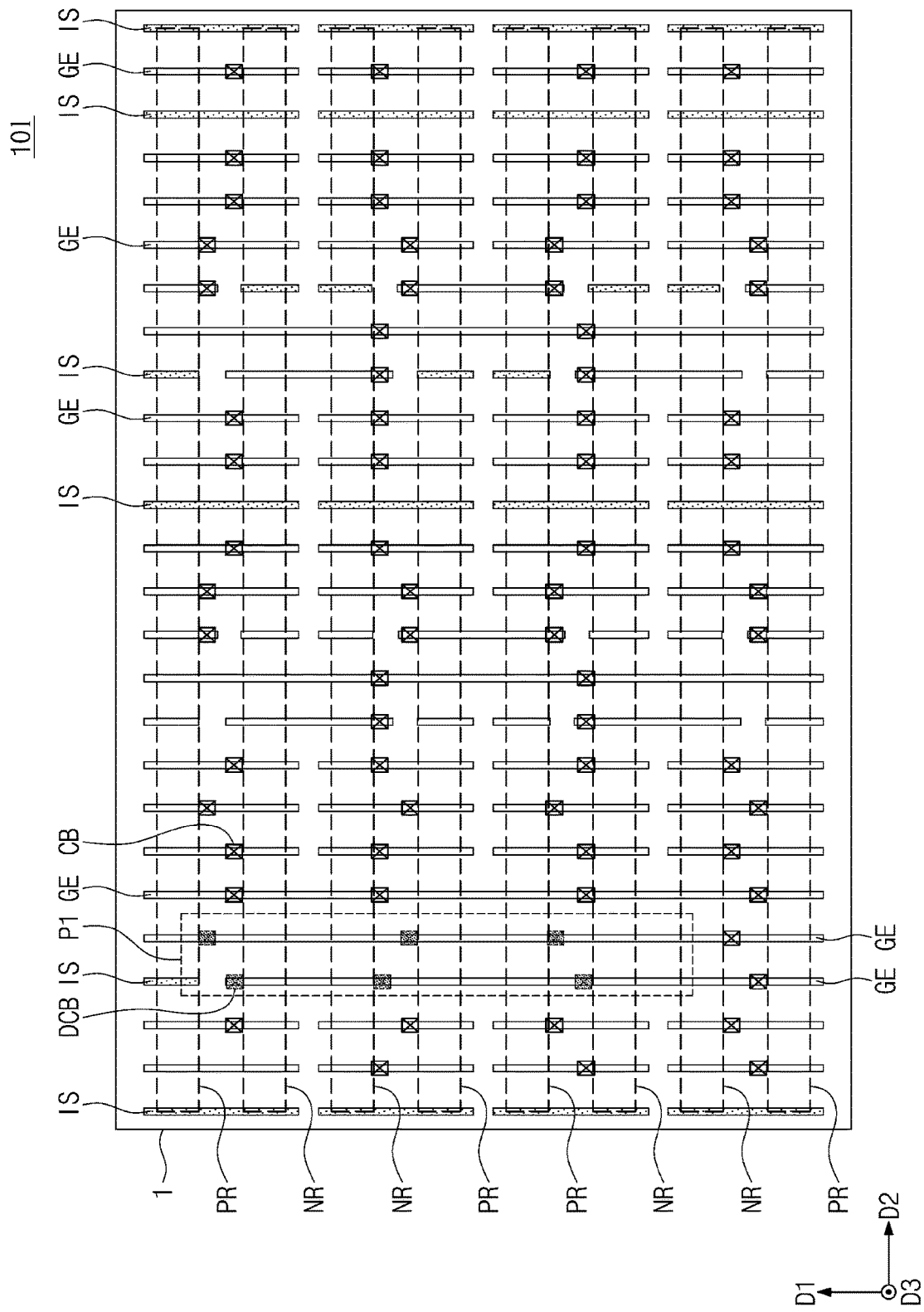

SEMICONDUCTOR DEVICE

CROSS-REFERENCE TO RELATED APPLICATIONS

This U.S. non-provisional patent application is a continuation of U.S. application Ser. No. 16/919,670 filed on Jul. 2, 2020, which claims priority under 35 U.S.C. § 119 to Korean Patent Application Nos. 10-2019-0094008, 10-2019-0097258, and 10-2020-0007423, filed on Aug. 1, 2019, Aug. 9, 2019, and Jan. 20, 2020, respectively, in the Korean Intellectual Property Office, the entire contents of which are hereby incorporated by reference.

BACKGROUND OF THE INVENTION

The present disclosure relates to a semiconductor device, and more particular, to a semiconductor device including a field effect transistor.

Due to their small-sized, multifunctional, and/or low-cost characteristics, semiconductor devices are being esteemed as important elements in the electronic industry. The semiconductor devices are classified into a semiconductor memory device for storing data, a semiconductor logic device for processing data, and a hybrid semiconductor device including both of memory and logic elements. As the electronic industry advances, there is an increasing demand for semiconductor devices with improved characteristics. For example, there is an increasing demand for semiconductor devices with high reliability, high performance, and/or multiple functions. To meet this demand, complexity and/or integration density of semiconductor devices are being increased.

SUMMARY

An embodiment of the inventive concept provides a semiconductor device with improved performance or reliability characteristics.

According to an exemplary embodiment of the present inventive concept, a semiconductor device includes a first gate electrode disposed on a substrate and extending in a first horizontal direction with respect to an upper surface of the substrate, a first gate contact and a dummy gate contact, which are spaced apart from each other in the first horizontal direction and are in contact with a top surface of the first gate electrode, a first interconnect line extending in a second horizontal direction, different from the first horizontal direction, with respect to the upper surface of the substrate and overlapping the first gate contact in a vertical direction with respect to the upper surface of the substrate, and a voltage generator configured to generate a first voltage and apply the first voltage to the first gate electrode via the first interconnect line and the first gate contact. The first gate electrode receives the first voltage via the first interconnect line and the first gate contact from the voltage generator. The dummy gate contact receives the first voltage via the first gate electrode.

According to an exemplary embodiment of the present inventive concept, a semiconductor device includes a plurality of gate electrodes on a substrate, each of the plurality of gate electrodes extending in a first horizontal direction with respect to an upper surface of the substrate and the plurality of gate electrodes being spaced apart from each other in a second horizontal direction, with respect to the upper surface of the substrate, different from the first horizontal direction, a plurality of gate contacts, each of the plurality of gate contacts being disposed on a respective one of the plurality of gate electrodes and electrically connected thereto, a plurality of interconnect lines, each of the plurality of interconnect lines extending in the second horizontal direction and overlapping, in a vertical direction with respect to the upper surface of the substrate, at least one gate contact of the plurality of gate contacts, and the plurality of interconnect lines being spaced apart from each other in the first horizontal direction, a voltage generator configured to generate a first voltage and apply the first voltage to the plurality of gate electrodes via the plurality of gate contacts and the plurality of interconnect lines, and a dummy gate contact disposed on a corresponding one gate electrode of the plurality of gate electrodes and spaced apart, in the first horizontal direction, from a gate contact disposed on the corresponding one gate electrode. The first voltage is applied to the dummy gate contact through the corresponding one gate electrode.

According to an exemplary embodiment of the present inventive concept, a semiconductor device includes a substrate including a first active region and a second active region, which are spaced apart from each other in a first horizontal direction with respect to an upper surface of the substrate, a plurality of active fins, which protrude from the substrate in a vertical direction with respect to the upper surface of the substrate and extend in a second horizontal direction, with respect to the upper surface, crossing the first horizontal direction, first to third gate electrodes, which cross the plurality of active fins in the first horizontal direction, are parallel to each other in the second horizontal direction, and are line-shape patterns, a first gate contact disposed on the second gate electrode and overlapping, in the vertical direction, a region between the first active region and the second active region, and a first dummy gate contact overlapping the second gate electrode in the vertical direction and spaced apart from the first gate contact in the first horizontal direction, the first dummy gate contact overlapping in the vertical direction or is adjacent, in the first horizontal direction, to one of the first active region and the second active region and at least two or three active fins of the plurality of active fins being disposed in each of the first active region and the second active region, a first interconnect line extending in the second horizontal direction and overlapping first gate contact in the vertical direction, and a voltage generator configured to generate a first voltage and apply the first voltage to the second gate electrode through the first gate contact and the first interconnect line. The first voltage is applied to the first dummy gate contact through the second gate electrode.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 15A and 15B are layouts illustrating a semiconductor device according to an embodiment of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Figure 1:
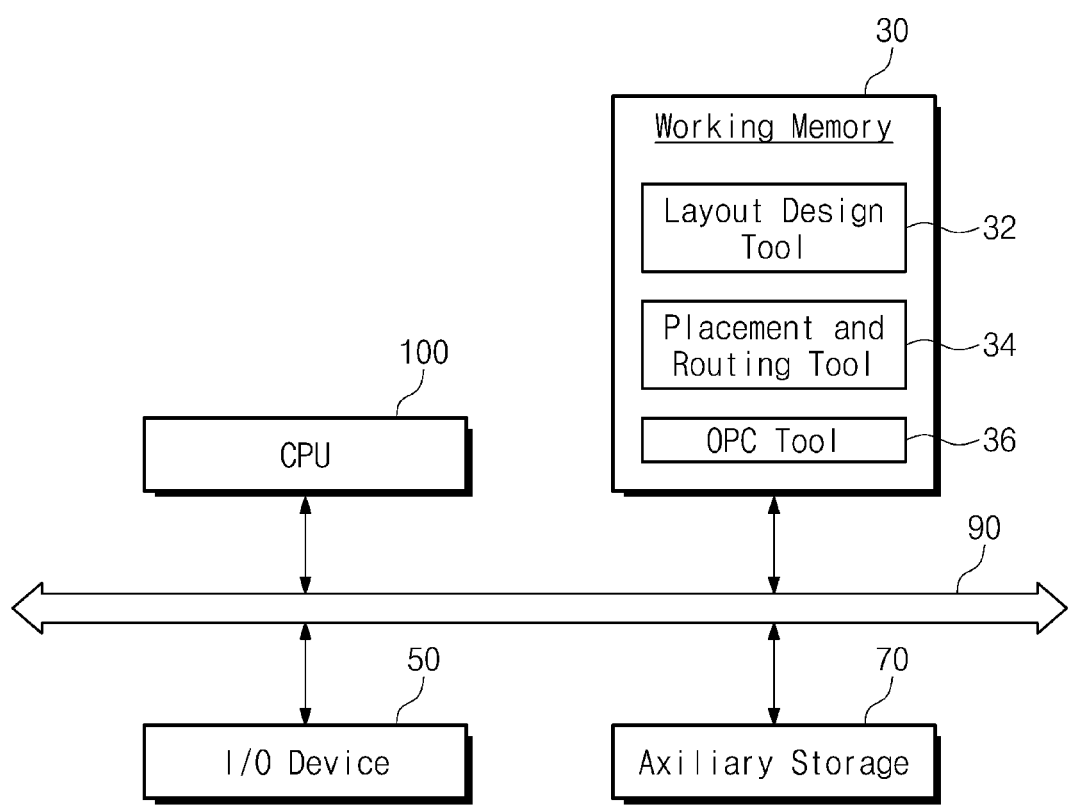
FIG. 1 is a block diagram illustrating a computer system which is configured to execute a semiconductor design process, according to an embodiment of the inventive concept.

FIG. 1 is a block diagram illustrating a computer system which is configured to execute a semiconductor design process, according to an embodiment of the inventive concept.

Referring to FIG. 1, a computer system may include a central processing unit (CPU) 100, a working memory 30, an input-output device 50, and an auxiliary memory device 70. In an embodiment, the computer system may be provided in the form of a customized system, which is configured to execute a layout design process according to the inventive concept. Furthermore, the computer system may be configured to carry out various design and check simulation programs.

The CPU 100 may be configured to run a variety of software programs, such as application programs, operating systems, and device drivers, which are executed on the computer system. The CPU 100 may run an operating system loaded on the working memory 30. Furthermore, the CPU 10 may run various application programs, which are executed based on the operating system. For example, the CPU 100 may run a layout design tool 32, a placement and routing tool 34, and/or an optical proximity correction (OPC) tool 36, which are loaded on the working memory 30.

The operating system or the application programs may be loaded on the working memory 30. For example, when the computer system starts a booting operation, an image of the operating system (not shown) stored in the auxiliary memory device 70 may be loaded on the working memory 30 in accordance with a predetermined booting sequence. In the computer system, the overall input/output operations may be managed by the operating system. Similarly, some application programs, which is selected by a user or is provided for basic services, may be loaded on the working memory 30.

The layout design tool 32, which is used for a layout design process, may be loaded on the working memory 30 from the auxiliary memory device 70. The placement and routing tool 34, which is used to place the designed standard cells and to route the placed standard cells, may be loaded on the working memory 30 from the auxiliary memory device 70. The OPC tool 36, which is used to execute an OPC process on the designed layout data, may be loaded on the working memory 30 from the auxiliary memory device 70. Different logic functions may be integrated into an integrated circuit (IC) using available design tools including electronic design automation (EDA) and computer aided design (CAD) tools. A standard cell includes a plurality of transistors that are used to implement logic functions. The logic functions may include Boolean functions (e.g., AND, OR, and NOT), storage functions (e.g., flip-flops, latches, and buffers), and digital combinational functions (e.g., multiplexers and demultiplexers). Each standard cell has a predetermined geometry (width and height). The EDA and CAD design tools include a library (known as a standard cell library) that stores the standard cell definitions for these logic functions. During semiconductor device design, the design tool selects one or more standard cells from the cell library based on the logic design and the process parameters (i.e., size and width of the standard cell) and places the cells in rows and columns. Upon completing the placement, the semiconductor device design is simulated, verified, and subsequently transferred to a chip (i.e., formed in Silicon).

The layout design tool 32 may be configured to change biasing data for some layout patterns. For example, the layout design tool 32 may be configured to allow the specific layout patterns to have shapes and positions different from those given by a design rule. Furthermore, the layout design tool 32 may be configured to execute a design rule check (DRC) operation, under the conduction of the changed bias data. The working memory 30 may be one of volatile memory devices (e.g., static or dynamic random access memory (SRAM or DRAM) devices) or nonvolatile memory devices (e.g., phase change RAM (PRAM), magnetoresistive RAM (MRAM), resistive RAM (ReRAM), ferroelectric RAM (FRAM), and NOR FLASH memory devices).

The input-output device 50 may be configured to control user's input and output data through user interface devices. For example, the input-output device 50 may include a keyboard or a monitor, which are used to receive relevant information from a designer. By using the input-output device 50, the designer may receive information on regions or data paths of a semiconductor device, which are needed to have adjusted operating characteristics. The input-output device 50 may also be used to display a status or result of a process executed by the OPC tool 36.

The auxiliary memory device 70 may be provided as a storage medium of the computer system. The auxiliary memory device 70 may be used to store the application programs, the image of the operating system, and various kinds of data. The auxiliary memory device 70 may be or include one of memory cards (e.g., MMC, eMMC, SD, MicroSD, and so forth), a hard disk drive (HDD), or a solid state drive (SSD). The auxiliary memory device 70 may include a NAND FLASH memory device with a large memory capacity. In an embodiment, the auxiliary memory device 70 may include next-generation non-volatile memory devices (e.g., PRAM, MRAM, ReRAM, and FRAM devices) or a NOR FLASH memory device.

A system interconnector 90 may be further provided as a system bus for an internal network of the computer system. The CPU 100, the working memory 30, the input-output device 50, and the auxiliary memory device 70 may be electrically connected to each other through the system interconnector 90 to exchange data between them. However, the structure of the system interconnector 90 may not be limited to this example, and in an embodiment, an additional data-exchanging element may be further provided to increase the efficiency in a data processing process.

Figure 2:
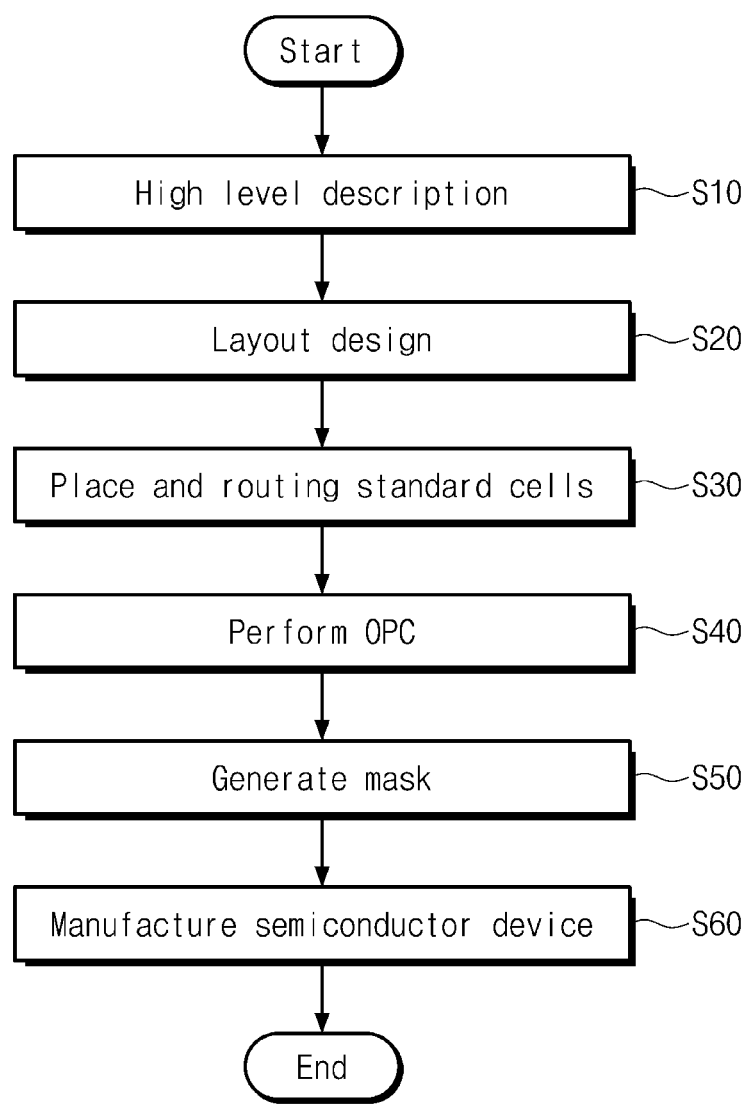
FIG. 2 is a flow chart illustrating a method of designing and fabricating a semiconductor device, according to an embodiment of the inventive concept.

FIG. 2 is a flow chart illustrating a method of designing and fabricating a semiconductor device, according to an embodiment of the inventive concept.

Referring to FIG. 2, a high-level design process may be performed on a semiconductor integrated circuit using the computer system described with reference to FIG. 1 (in S10). For example, in the high-level design process, an integrated circuit, which is a target object in a design process, may be described in terms of a high-level computer language. In an embodiment, the C language may be an example of the high-level computer language. Circuits designed by the high-level design process may be more concretely described by a register-transfer-level (RTL) coding or a simulation. Furthermore, codes generated by the RTL coding may be converted into a netlist, and the results may be combined to describe the entirety of the semiconductor device. The combined schematic circuit may be verified by a simulation tool, and in certain cases, an adjusting step may be further performed in consideration of a result of the verification step.

A layout design process may be performed to realize a logically-prepared form of the semiconductor integrated circuit on a silicon substrate (in S20). For example, the schematic circuit prepared in the high-level design process or the corresponding netlist may be referred to during the layout design process.

A cell library, which is used for the layout design process, may contain information on operation, speed, and power consumption of a standard cell. Most of the layout design tools may be configured to define a cell library, which is used to represent a gate-level circuit in the form of a layout. Here, the layout may be prepared to define geometrical features (e.g., shapes, positions, or dimensions) of patterns, which are used to form transistors and interconnection lines to be integrated on a silicon substrate. For example, formation of an inverter circuit on a silicon substrate may include placing patterns in at least one or more layers of layouts to implement constituent elements (e.g., PMOS, NMOS, N-WELL, gate electrodes, and interconnection lines thereon) of the inverter circuit. Then, a searching operation may be performed to choose the most suitable inverter layout from the inverter layouts which have been stored in the cell library.

A step of placing various standard cells, which are stored in the cell library, and establishing a routing structure may be performed (in S30). For example, the standard cells may be placed to form a two-dimensional arrangement. Then, routing patterns may be placed on the placed standard cells. The routing step may be performed to connect the placed standard cells to each other in the previously-designed manner. The steps of placing and routing the standard cells may be automatically executed by the placement and routing tool 34.

After the routing step, a verification step may be performed on the layout to check whether there is a portion violating the given design rule. In an embodiment, the verification step may include evaluating verification items, such as a design rule check (DRC), an electrical rule check (ERC), and a layout vs schematic (LVS). Here, the DRC may be performed to evaluate whether the layout meets the given design rule, the ERC may be performed to evaluate whether there is an electrical disconnection issue in the layout, and the LVS may be performed to evaluate whether the layout is prepared to coincide with the gate-level netlist.

An OPC step may be performed (in S40). In general, optical proximity effects may occur when a photolithography process is performed on a silicon wafer using a photomask, which is manufactured based on the designed layout. The OPC step may be performed to correct the optical proximity or distortion issues in the photolithography process. For example, in the OPC step, the layout may be modified to reduce a difference in shape between designed patterns and actually-formed patterns, which may be caused by the optical proximity effects or during an exposure step of the photolithography process. As a result of the OPC step, the designed shapes and positions of the layout patterns may be slightly changed or biased.

A photomask may be generated, based on the layout modified by the OPC step (in S50). In general, the photomask may be manufactured by patterning a chromium layer, which is formed on a glass substrate, in such a way to depict the layout pattern.

The manufactured photomask may be used to manufacture a semiconductor device (in S60). In the fabricating process, various exposing and etching steps may be performed or repeated to sequentially form patterns, which are defined in the layout design process, on a silicon substrate.

Figure 3A:
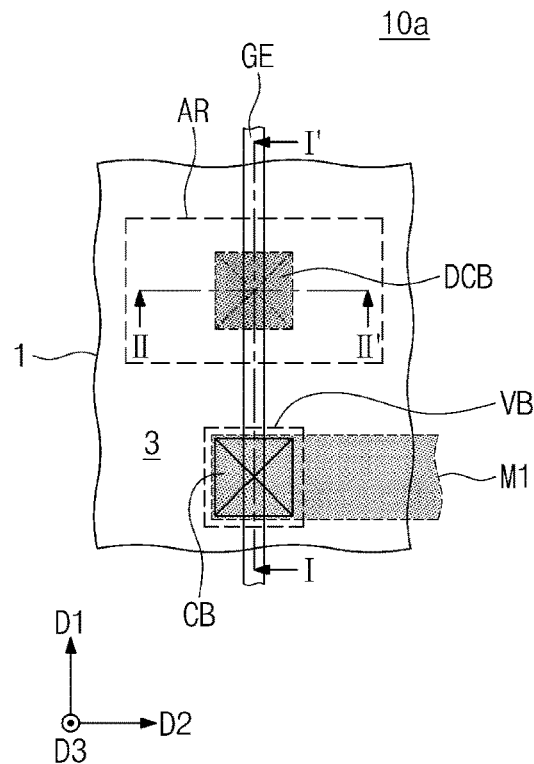
FIGS. 3A, 3B, and 3C are layouts, each of which illustrates a semiconductor device according to an embodiment of the inventive concept.
Figure 3B:
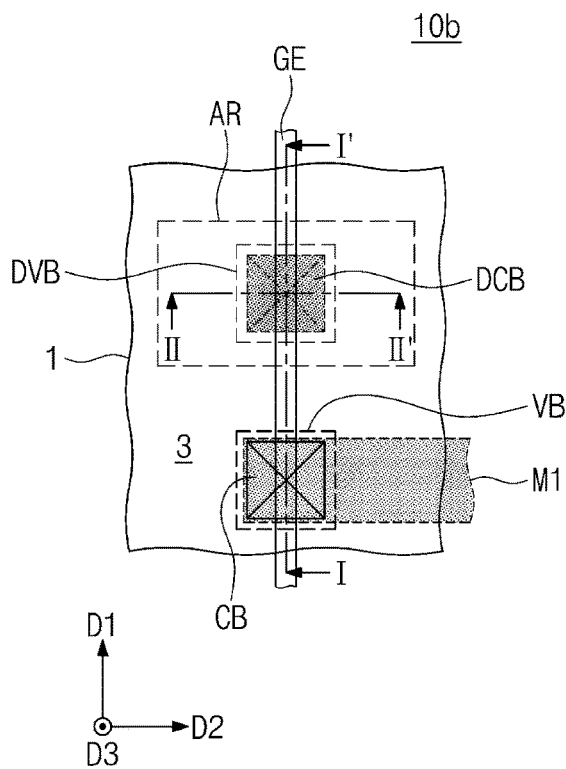
Figure 3C:
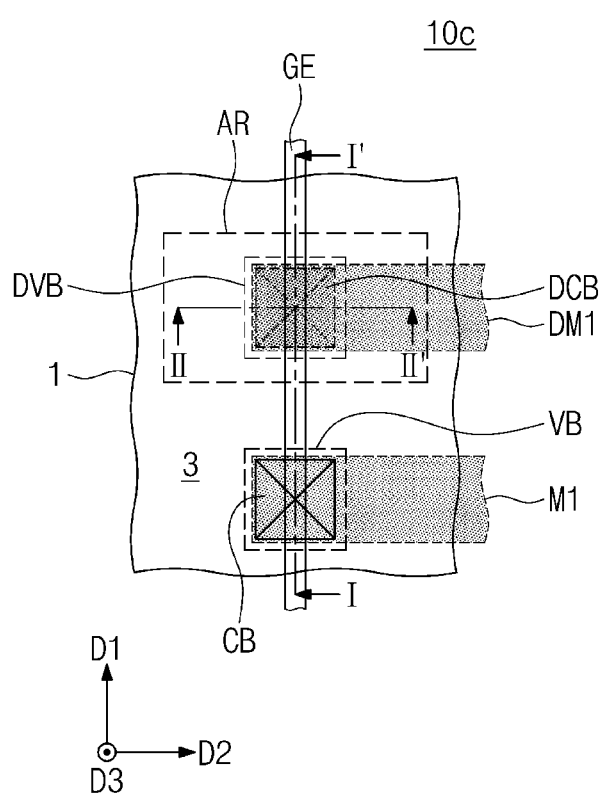
Figure 4A:
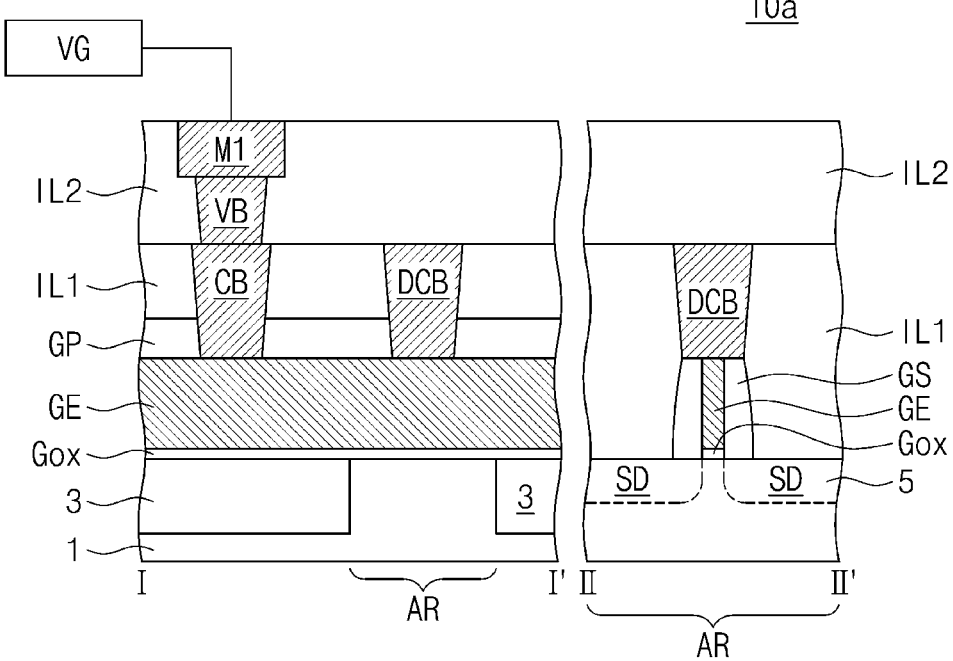
FIGS. 4A, 4B, and 4C are sectional views, which are taken along lines I-I' and II-II' of FIGS. 3A, 3B, and 3C, respectively.
Figure 4B:
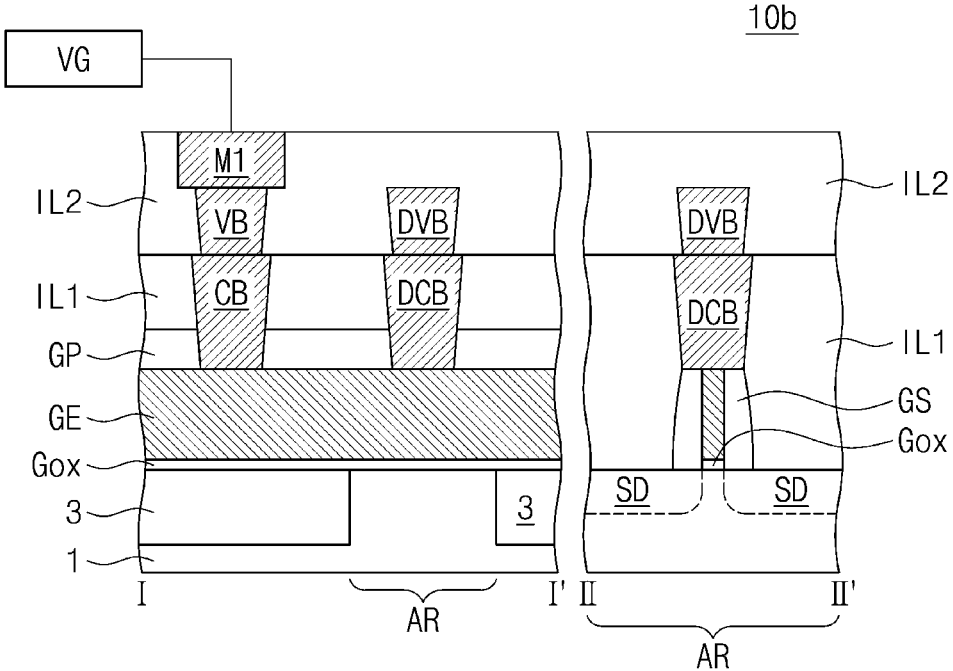
Figure 4C:
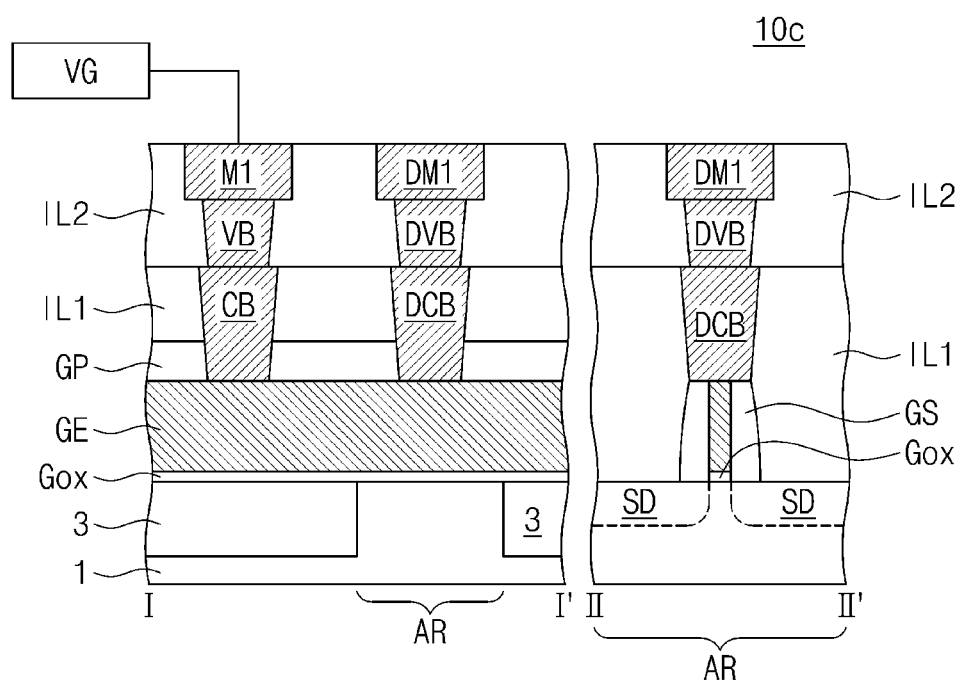

FIGS. 3A, 3B, and 3C are layouts, each of which illustrates a semiconductor device according to an embodiment of the inventive concept. FIGS. 4A, 4B, and 4C are sectional views, which are taken along lines I-I' and of FIGS. 3A, 3B, and 3C, respectively.

Referring to FIGS. 3A and 4A, a semiconductor device 10a may be provided on a substrate 1. The layout of FIG. 3 may correspond to a portion of a layout of a standard cell. In the present embodiment, the semiconductor device 10a may be a single transistor. The substrate 1 may be a semiconductor substrate (e.g., of silicon, germanium, or silicon-germanium) or a compound semiconductor substrate. As an example, the substrate 1 may be a silicon wafer. A device isolation layer 3 may be disposed in the substrate 1 to define an active region AR. The active region AR of the substrate 1 may be doped with n-type or p-type impurities. The active region AR may be a PMOSFET region or an NMOSFET region.

A gate electrode GE may be disposed to cross the active region AR. The gate electrode GE may be a line-shaped structure, which is extended in a first direction D1. The gate electrode GE may be formed of or include a conductive material. For example, the gate electrode GE may be formed of or include at least one of doped polysilicon, metal nitrides, metal silicides, or metal-containing materials. A gate insulating layer Gox may be interposed between the gate electrode GE and the substrate 1. The gate insulating layer Gox may include a silicon oxide layer and/or a high-k dielectric layer whose dielectric constant is higher than that of the silicon oxide layer. The high-k dielectric layer may include metal oxides (e.g., aluminum oxide or hafnium oxide). The gate electrode GE may be covered with a gate capping pattern GP. The gate capping pattern GP may be formed of or include at least one of, for example, silicon oxide, silicon nitride, or silicon oxynitride and may have a single-layered or multi-layered structure.

Source/drain regions 5 may be provided in portions of the substrate 1 at opposite sides of the gate electrode GE. The source/drain region 5 may be doped to have a conductivity type different from that of the substrate 1. For example, in the case where the active region AR is a PMOSFET region, the substrate 1 may be doped with n-type impurities and the source/drain region 5 may be doped with p-type impurities. In the case where the active region AR is an NMOSFET region, the substrate 1 may be doped with p-type impurities and the source/drain region 5 may be doped with n-type impurities. Gate spacers GS may be disposed on opposite side surfaces of the gate electrode GE. The gate spacer GS may be formed of or include at least one of, for example, silicon oxide, silicon nitride, or silicon oxynitride and may have a single-layered or multi-layered structure.

The gate electrode GE, the gate capping pattern GP, the gate spacer GS, the substrate 1, and the device isolation layer 3 may be covered with a first interlayered insulating layer IL1. The first interlayered insulating layer IL1 may be formed of or include at least one of, for example, silicon nitride, silicon oxide, silicon oxynitride, low-k dielectric materials, and porous materials and may have a single-layered or multi-layered structure.

A gate contact CB and a dummy gate contact DCB may be provided to penetrate the first interlayered insulating layer IL1 and the gate capping pattern GP and to be in contact with the gate electrode GE. The gate contact CB and the dummy gate contact DCB may be spaced apart from each other in the first direction D1. The dummy gate contact DCB may overlap the active region AR. The gate contact CB may overlap the device isolation layer 3. The gate contact CB may be horizontally spaced apart from the active region AR in a top down view. The dummy gate contact DCB may have the same size and height as the gate contact CB. A top surface of the dummy gate contact DCB may be positioned at the same height as a top surface of the gate contact CB. A bottom surface of the dummy gate contact DCB may be positioned at the same height as a bottom surface of the gate contact CB. The term "contact," as used herein, refers to a direct connection (i.e., touching) unless the context indicates otherwise. As used herein, the term "dummy" is used to refer to a component that has the same or similar structure and shape as other components but does not have a substantial function and exists only as a pattern in the device.

A second interlayered insulating layer IL2 may be disposed on the first interlayered insulating layer ILL The second interlayered insulating layer IL2 may be formed of or include at least one of, for example, silicon nitride, silicon oxide, silicon oxynitride, low-k dielectric materials, and porous materials and may have a single-layered or multi-layered structure. A first line (e.g., an interconnect line) M1 and a gate via VB may be disposed in the second interlayered insulating layer IL2. The gate via VB may electrically connect the first line M1 to the gate contact CB. The gate via VB and the first line M1 may not be disposed on the dummy gate contact DCB and may not be electrically connected to the dummy gate contact DCB. A voltage may be applied to the gate electrode GE through the gate contact CB. The dummy gate contact DCB may not be used to apply a voltage to an element. For example, a voltage generator VG may generate the voltage and apply the voltage to the gate electrode GE through the gate contact CB, and the voltage may be applied to the dummy gate contact DCB via the gate electrode GE. The gate contact CB may be configured to deliver a voltage to the gate electrode GE. The dummy gate contact DCB may not be used to deliver any voltage to the gate electrode GE. An electrical connection between the voltage generator VG and the first line M1 may be made using interconnect lines positioned at the same level as the first line M1 or positioned at a higher level than the first line M1. Such connection may be formed by functional blocks including a row decoder, for example. For the simplicity of drawings, the electrical connection between the voltage generator VG and the first line M1 and the functional blocks may be omitted.

In certain embodiments, as shown in FIGS. 3B and 4B, a semiconductor device 10b may further include a dummy gate via DVB disposed on the dummy gate contact DCB. The dummy gate via DVB may not be used to apply a voltage to an element. The gate contact CB and the gate via VB may be configured to deliver a voltage to the gate electrode GE. The dummy gate contact DCB and the dummy gate via DVB may not be used to deliver any voltage to the gate electrode GE.

In certain embodiments, as shown in FIGS. 3C and 4C, a semiconductor device 10c may further include the dummy gate via DVB and a dummy line DM1 disposed on the dummy gate contact DCB. The dummy line DM1 may not be used to apply a voltage to an element. The gate contact CB, the gate via VB and the first line M1 may be configured to deliver a voltage to the gate electrode GE. The dummy gate contact DCB, the dummy gate via DVB and the dummy line DM1 may not be used to deliver any voltage to the gate electrode GE. In certain embodiments, the first line M1 may be connected to an auxiliary line, which will be described with reference to FIG. 17, and may the same voltage may be applied to the first line M1 and the auxiliary line from the voltage generator VG.

In FIGS. 3A to 3C and 4A to 4C, the semiconductor devices 10a, 10b, and 10c are illustrated to be planar-type transistors, but the inventive concept is not limited to this example or a specific embodiment. For example, a semiconductor device according to an embodiment of the inventive concept may be a fin field effect transistor (FinFET), a multi-bridge channel field effect transistor (MBCFET®), a vertical field effect transistor (VFET), or a negative capacitance field effect transistor (NCFET).

Each of the semiconductor devices 10a, 10b, and 10c may include the dummy gate contact DCB. The dummy gate contact DCB, which overlap the active region AR, may cause a change in characteristics of the semiconductor devices 10a, 10b, and 10c. For example, the dummy gate contact DCB may weakly exert an electric/mechanical stress on the channel region. In the case where the semiconductor devices 10a, 10b, and 10c are PMOSFETs, such a stress may lead to an increase in mobility of holes in the channel region, and thus, an operation speed of the semiconductor device may increase. By contrast, in the case where the semiconductor devices 10a, 10b, and 10c are NMOSFETs, the mobility of electrons in the channel region may decrease due to the stress, but threshold voltage of the NMOSFETs increase and leakage current thereof reduce. As the semiconductor devices 10a, 10b, and 10c are being scaled down, a length of the channel region below the gate electrode GE may become smaller and smaller. Thus, the presence of the dummy gate contact DCB may greatly affect the characteristics of the semiconductor devices 10a, 10b, and 10c. According to an embodiment of the inventive concept, in the steps S20 or S30 of FIG. 2, the dummy gate contact DCB may be placed at a suitable position to increase the performance of the device. A photomask may be manufactured based on the aforementioned layout and then may be used to fabricate the semiconductor devices 10a, 10b, and 10c.

Figure 5:
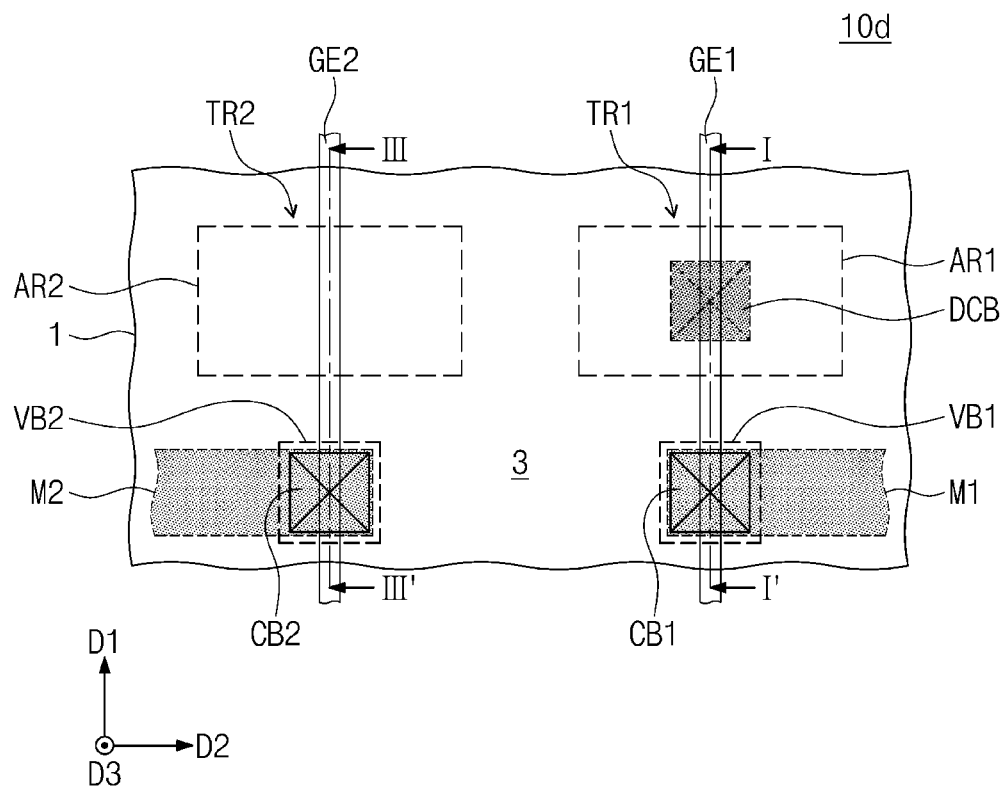
FIG. 5 is a layout illustrating a semiconductor device according to an embodiment of the inventive concept.
Figure 6:
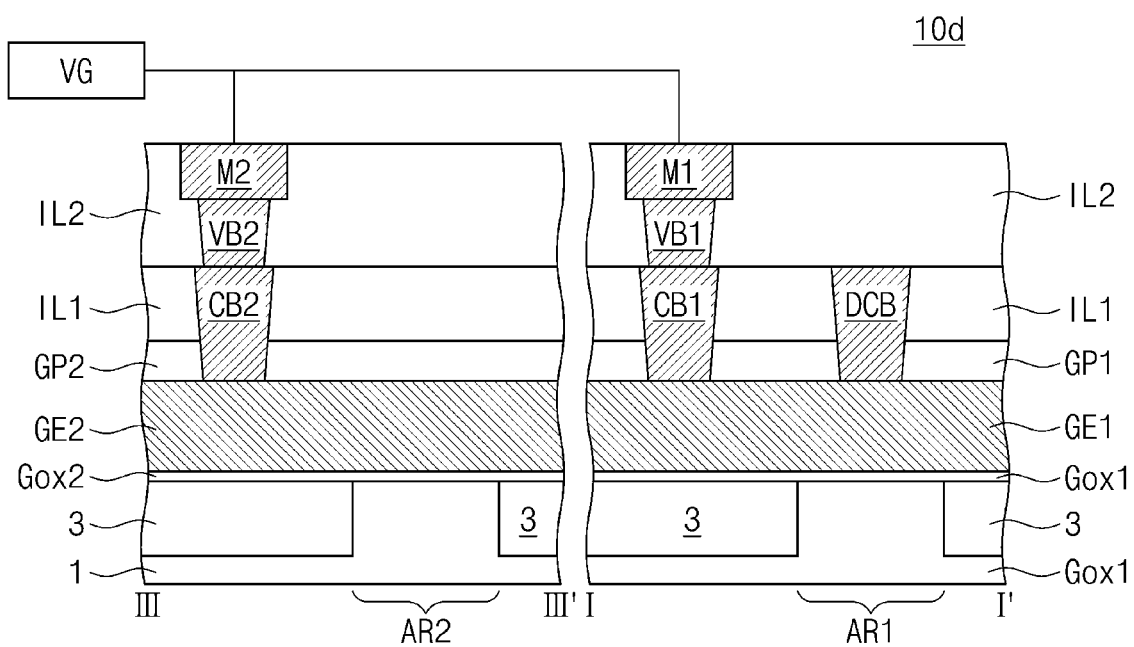
FIG. 6 is a sectional view illustrating vertical sections taken along lines I-I' and III-III' of FIG. 5.

FIG. 5 is a layout illustrating a semiconductor device according to an embodiment of the inventive concept. FIG. 6 is a sectional view illustrating vertical sections taken along lines I-I' and III-III' of FIG. 5.

Referring to FIGS. 5 and 6, the semiconductor device 10a may include a first transistor TR1 and a second transistor TR2, which are disposed on the substrate 1 and are spaced apart from each other. The first transistor TR1 may be substantially the same as those described with reference to FIGS. 3 and 4. The second transistor TR2 may not include the dummy gate contact DCB. In certain embodiments, the first transistor TR1 may include a first gate electrode GE1 crossing a first active region AR1. A first gate insulating layer Gox1 may be interposed between the first gate electrode GE1 and the substrate 1. A first gate capping pattern GP1 may be disposed on the first gate electrode GE1. The dummy gate contact DCB may overlap the first active region AR1. For example, the dummy gate contact DCB may overlap a channel region of the first active region AR1 between source/drain regions with the channel region therebetween.

The second transistor TR2 may include a second gate electrode GE2 crossing a second active region AR2. A second gate insulating layer Gox2 may be interposed between the second gate electrode GE2 and the substrate 1. A second gate capping pattern GP2 may be disposed on the second gate electrode GE2. No dummy contact as described above may overlap the second active region AR2. For the second transistor TR2 which is a transistor with a different type from that of the first transistor TR1 (e.g., the second transistor of NMOSFETs and the first transistor of PMOSFETs or vice versa), the second gate electrode GE2 may be formed of or include a conductive material different from the first gate electrode GE1. The second gate insulating layer Gox2 may be formed of or include an insulating material or a high-k dielectric material that is different from the first gate insulating layer Gox1. The second gate capping pattern GP2 and the first gate capping pattern GP1 may be formed of or include the same insulating material or insulating materials different from each other.

Although not shown, first source/drain regions may be disposed in the substrate 1 on opposite sides of the first gate electrode GE1, and second source/drain regions may be disposed in the substrate 1 on opposite sides of the second gate electrode GE2. For the second transistor TR2 which is a transistor with a different type from that of the first transistor TR1 (e.g., the second transistor of NMOSFETs and the first transistor of PMOSFETs or vice versa), the first source/drain region and the second source/drain region may differ from each other in the kind or concentration of dopants therein.

The first transistor TR1 and the second transistor TR2 may be covered with the first interlayered insulating layer IL1. Each of a first gate contact CB1 and the dummy gate contact DCB may be provided to penetrate the first interlayered insulating layer IL1 and the first gate capping pattern GP1 and to be in contact with the first gate electrode GE1. The dummy gate contact DCB may overlap the first active region AR1, and the first gate contact CB1 may be spaced apart from the first active region AR1. In certain embodiments, the first gate contact CB1 may be vertically spaced apart from the first active region AR1. A second gate contact CB2 may be provided to pass through the first interlayered insulating layer IL1 and the second gate capping pattern GP2 and to be in contact with the second gate electrode GE2.

The first interlayered insulating layer IL1 may be covered with the second interlayered insulating layer IL2. A first gate via VB1 and the first line M1 may be disposed in the second interlayered insulating layer IL2 and may be electrically connected to the first gate contact CB1. A second gate via VB2 and a second line M2 may be disposed in the second interlayered insulating layer IL2 and may be electrically connected to the second gate contact CB2. Except for the aforementioned differences, the semiconductor device according to the present embodiment may have substantially the same features as that described with reference to FIGS. 3A to 3B and 4A to 4B.

Figure 7:
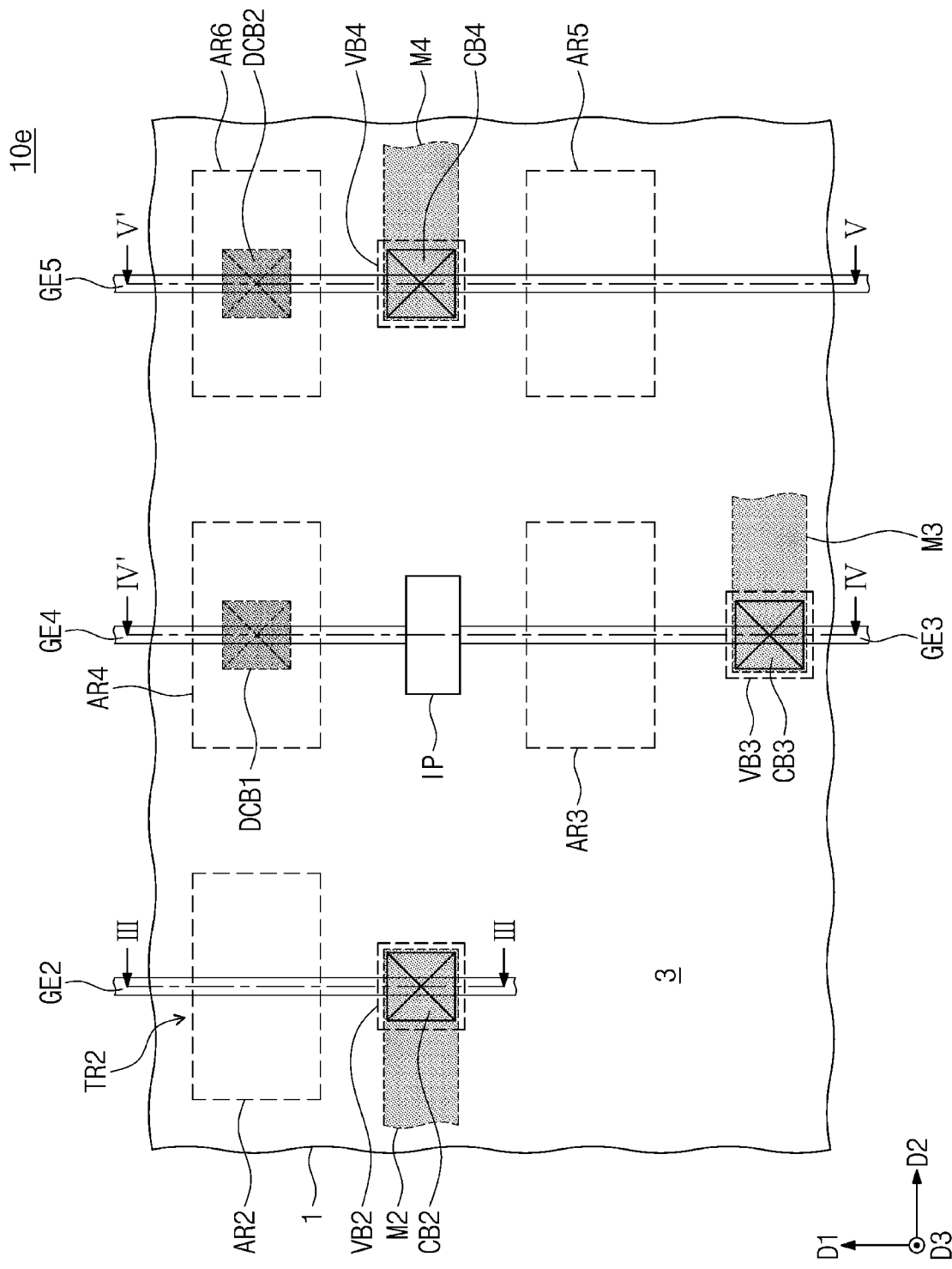
FIG. 7 is a layout of a semiconductor device according to an embodiment of the inventive concept.
Figure 8:
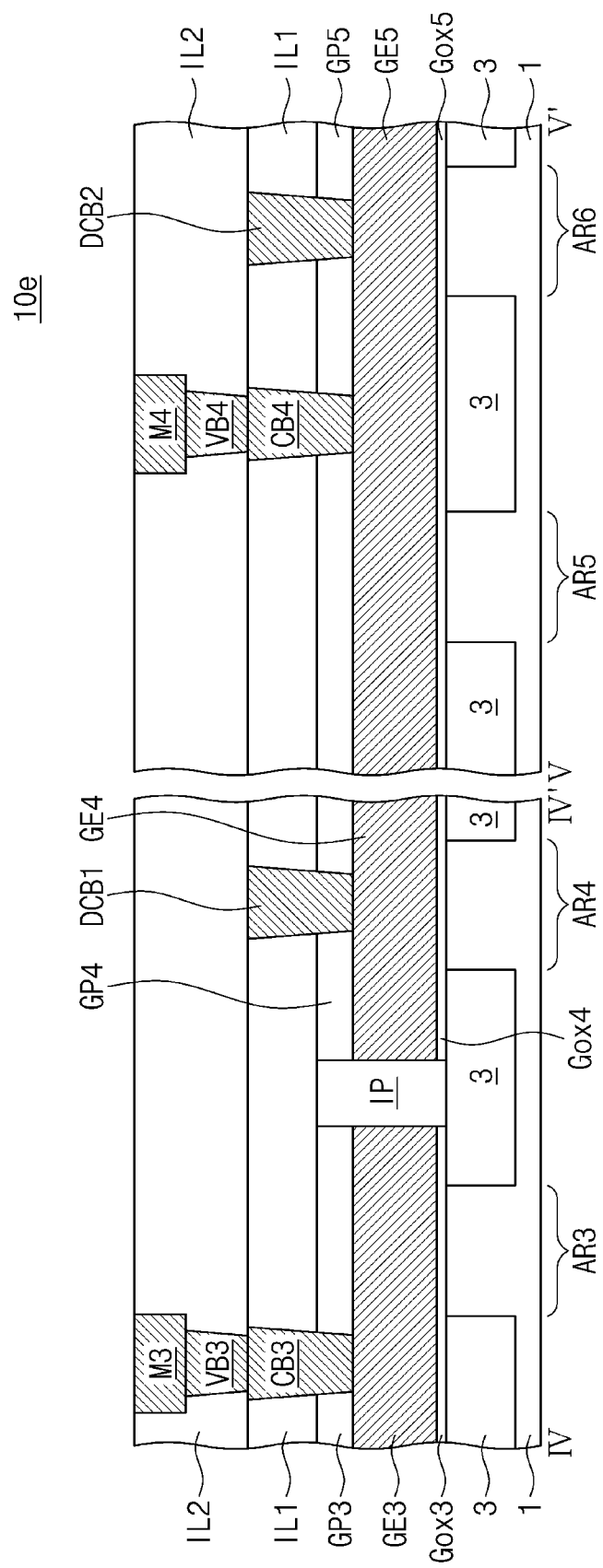
FIG. 8 is a sectional view taken along a line IV-IV' and V-V' of FIG. 7.

FIG. 7 is a layout of a semiconductor device according to an embodiment of the inventive concept. FIG. 8 is a sectional view taken along line IV-IV' and V-V of FIG. 7.

In the semiconductor device 10b according to the present embodiment, the device isolation layer 3 may be disposed on the substrate 1 to define second to fifth active regions AR2-AR5 spaced apart from each other, as shown in FIGS. 7 and 8. Each of the second to fifth active regions AR2-AR5 of the substrate 1 may be doped with n-type or p-type impurities. The second gate electrode GE2 may be disposed to cross the second active region AR2. The second gate electrode GE2 may be included in the second transistor TR2 described with reference to FIGS. 5 and 6. The second transistor TR2 may be configured to have a structure similar to that in the aforementioned embodiment, and thus, the overlapping description thereof will be omitted.

A third active region AR3 and a fourth active region AR4 may be spaced apart from each other in the first direction D1. A third gate electrode GE3 may be disposed to cross the third active region AR3, and a fourth gate electrode GE4 may be disposed to cross the fourth active region AR4. Each of the third and fourth gate electrodes GE3 and GE4 may be a line-shaped pattern extending in the first direction D1. The third and fourth gate electrodes GE3 and GE4 may be located on a single straight line extending in the first direction. The third and fourth gate electrodes GE3 and GE4 may be spaced apart from each other by a gate separation pattern IP. In certain embodiments, a conductive line may be separated into the third gate electrode GE3 and the fourth gate electrode GE4 by the gate separation pattern IP.

A third gate insulating layer Gox3 may be interposed between the third gate electrode GE3 and the substrate 1. A fourth gate insulating layer Gox4 may be interposed between the fourth gate electrode GE4 and the substrate 1. The third and fourth gate electrodes GE3 and GE4 may be formed of the same material and may have the same structure. The third and fourth gate insulating layers Gox3 and Gox4 may be formed of the same material and may have the same structure. A third gate capping pattern GP3 may be disposed on the third gate electrode GE3, and a fourth gate capping pattern GP4 may be placed on the fourth gate electrode GE4. The third and fourth gate capping patterns GP3 and GP4 may be formed of the same material and may have the same structure.

The gate separation pattern IP may be formed of or include at least one of silicon oxide, silicon nitride, or silicon oxynitride. The gate separation pattern IP may be interposed between the third and fourth gate capping patterns GP3 and GP4, between the third and fourth gate electrodes GE3 and GE4, and between the third and fourth gate insulating layers Gox3 and Gox4 and may be in contact with the device isolation layer 3.

The fifth active region AR5 and a sixth active region AR6 may be spaced apart from each other in the first direction D1. The fifth and sixth active regions AR5 and AR6 of the substrate 1 may be respectively doped with impurities whose conductivity types are different from each other. A fifth gate electrode GE5 may be disposed to cross the fifth and sixth active regions AR5 and AR6. A fifth gate insulating layer Gox5 may be interposed between the fifth gate electrode GE5 and the substrate 1. A fifth gate capping pattern GP5 may be disposed on the fifth gate electrode GE5.

The second to fifth gate electrodes GE2-GE5 and the substrate 1 may be sequentially covered with the first and second interlayered insulating layers IL1 and IL2. A third line M3 and a third gate via VB3, which are disposed in the second interlayered insulating layer IL2, may be electrically connected to the third gate electrode GE3 through a third gate contact CB3, which is formed to penetrate the first interlayered insulating layer IL1 and the third gate capping pattern GP3. A fourth line M4 and a fourth gate via VB4, which are disposed in the second interlayered insulating layer IL2, may be electrically connected to the fifth gate electrode GE5 through a fourth gate contact CB4, which is formed to penetrate the first interlayered insulating layer IL1 and the fifth gate capping pattern GP5.

A first dummy gate contact DCB1 may be provided to penetrate the first interlayered insulating layer IL1 and the fourth gate capping pattern GP4 and to be in contact with the fourth gate electrode GE4. A second dummy gate contact DCB2 may be provided to penetrate the first interlayered insulating layer IL1 and the fifth gate capping pattern GP5 and to be in contact with the fifth gate electrode GE5. The first and second dummy contacts DCB1 and DCB2 may not be used to apply a voltage to an element. A gate contact and an interconnect line may be electrically connected to the fourth gate electrode GE4 to apply a voltage thereto, but for the simplicity of drawings, they are not shown.

Figure 9:
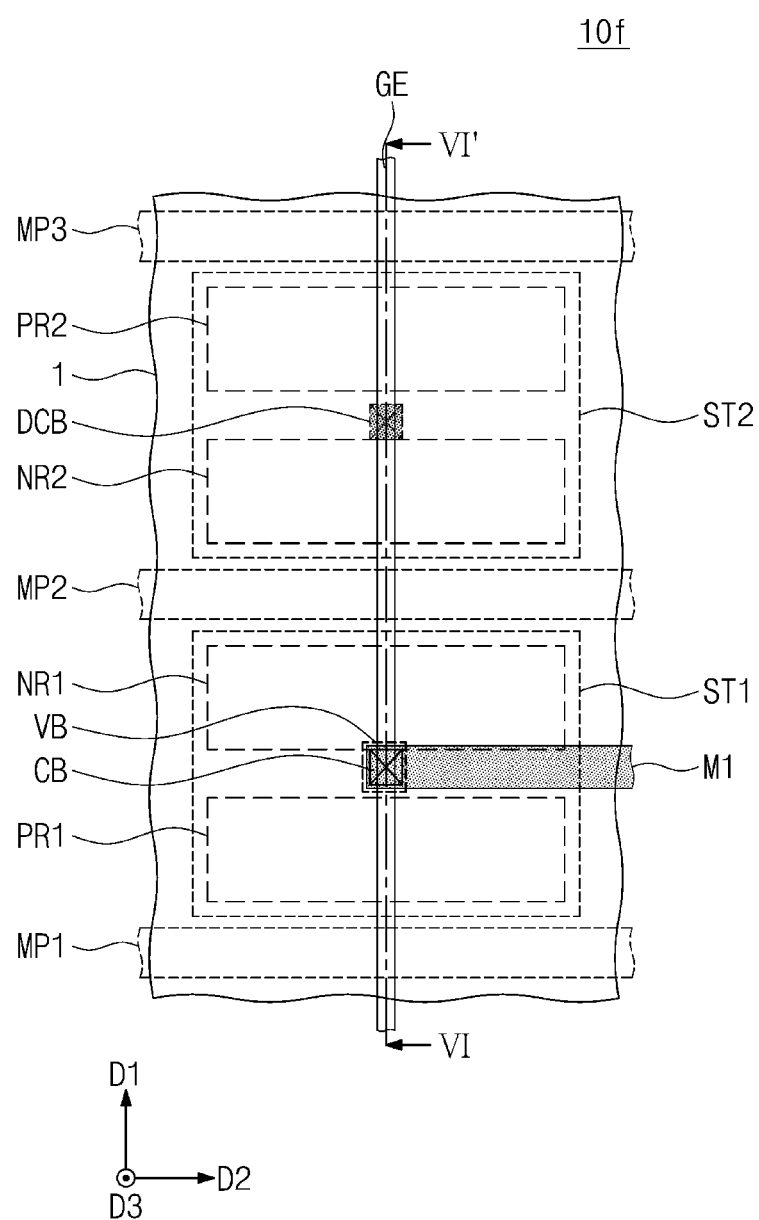
FIG. 9 is a layout of a semiconductor device according to an embodiment of the inventive concept.
Figure 10:
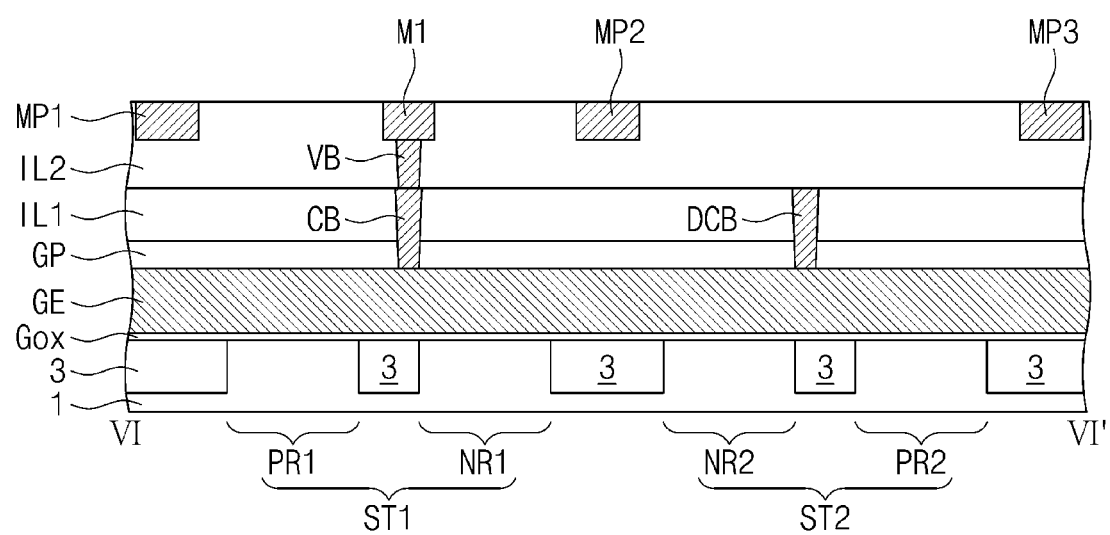
FIG. 10 is a sectional view taken along a line VI-VI' of FIG. 9.

FIG. 9 is a layout of a semiconductor device according to an embodiment of the inventive concept. FIG. 10 is a sectional view taken along line VI-VI' of FIG. 9.

Referring to FIGS. 9 and 10, the semiconductor device 10f according to the present embodiment may include a first standard cell ST1 and a second standard cell ST2, which are disposed on the substrate 1 to be adjacent to each other in the first direction D1. The first standard cell ST1 may include a first NMOS region NR1 and a first PMOS region PR1, which are spaced apart from each other by the device isolation layer 3. The second standard cell ST2 may include a second NMOS region NR2 and a second PMOS region PR2, which are spaced apart from each other by the device isolation layer 3. The first NMOS region NR1 may be adjacent to the second NMOS region NR2. The first and second NMOS regions NR1 and NR2 may be disposed between the first PMOS region PR1 and the second PMOS region PR2. The first standard cell ST1 and the second standard cell ST2 may include or share the gate electrode GE, which is disposed to cross all of the regions NR1, PR1, NR2, and PR2.

A first power line MP1 may be disposed adjacent to the first PMOS region PR1 of the first standard cell ST1. A second power line MP2 may be provided between the first and second standard cells ST1 and ST2. A third power line MP3 may be disposed adjacent to the second PMOS region PR2 of the second standard cell ST2. A first voltage may be applied to the first power line MP1 and the third power line MP3. A second voltage, which is different from the first voltage, may be applied to the second power line MP2. One of the first and second voltages may be a power voltage (Vdd), and the other a ground voltage (Vss).

The first line M1 may be disposed between the first PMOS region PR1 and the first NMOS region NR1. The first line M1 may be electrically connected to the gate electrode GE through the gate via VB and the gate contact CB. The dummy gate contact DCB may be disposed between the second PMOS region PR2 and the second NMOS region NR2 to be in contact with the gate electrode GE. The dummy gate contact DCB may be closer to the second NMOS region NR2 than to the second PMOS region PR2. In an embodiment, the dummy gate contact DCB may overlap a boundary between the second NMOS region NR2 and the device isolation layer 3 adjacent thereto in a top down view. In certain embodiments, unlike that in FIG. 9, the dummy gate contact DCB may be closer to the second PMOS region PR2 than to the second NMOS region NR2.

Figure 11:
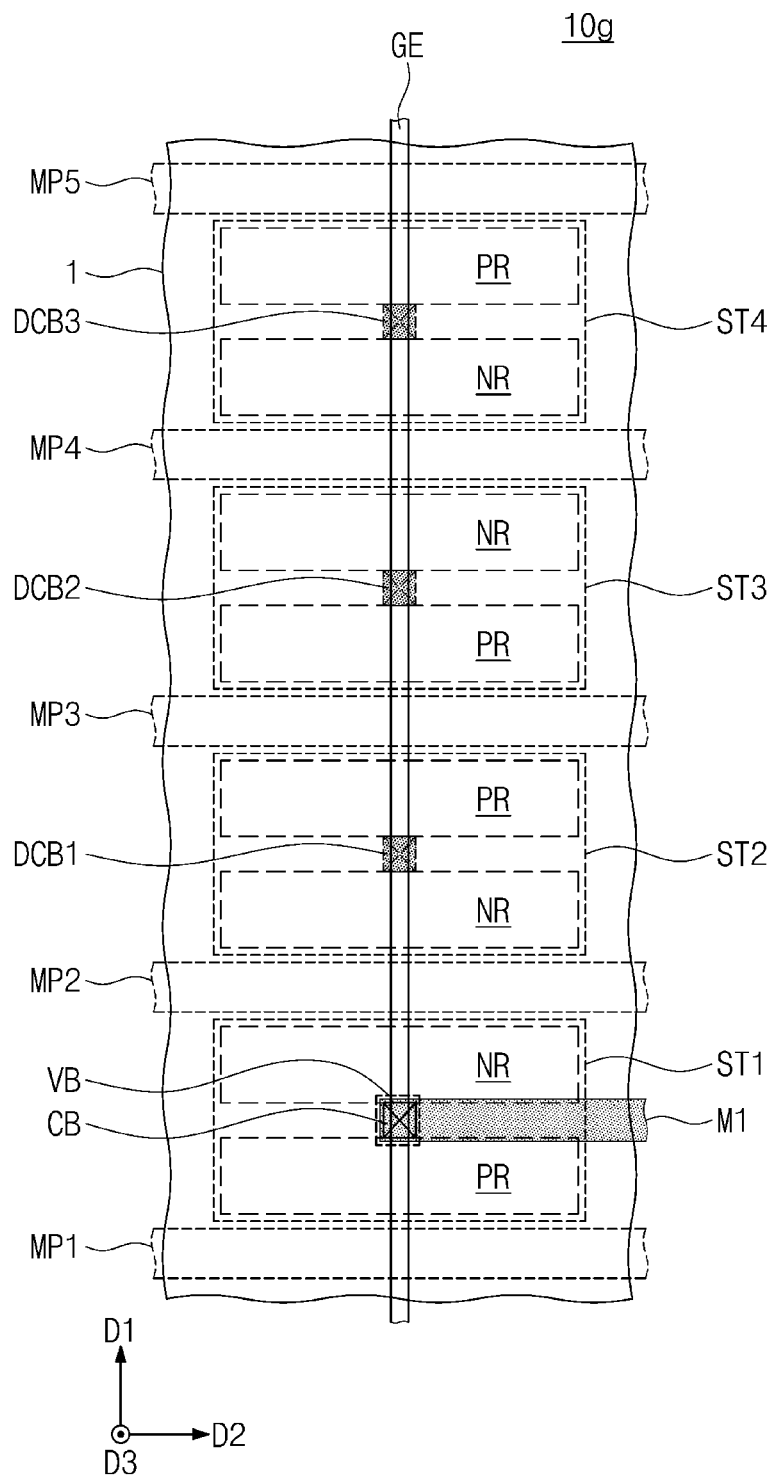
FIG. 11 is a layout of a semiconductor device according to an embodiment of the inventive concept.

FIG. 11 is a layout of a semiconductor device according to an embodiment of the inventive concept.

Referring to FIG. 11, a semiconductor device 10g may include first to fourth standard cells ST1-ST4, which are arranged on the substrate 1 to form a single column in the first direction D1. Each of the first to fourth standard cells ST1-ST4 may include an NMOS region NR and a PMOS region PR. An arrangement of the NMOS region NR and the PMOS region PR of the first standard cell ST1 may be symmetric to an arrangement of the NMOS region NR and the PMOS region PR of the second standard cell ST2. An arrangement of the NMOS region NR and the PMOS region PR of the third standard cell ST3 may be symmetric to an arrangement of the NMOS region NR and the PMOS region PR of the second standard cell ST2. An arrangement of the NMOS region NR and the PMOS region PR of the fourth standard cell ST4 may be symmetric to an arrangement of the NMOS region NR and the PMOS region PR of the third standard cell ST3. The first power line MP1 may be disposed adjacent to the PMOS region PR of the first standard cell ST1. The second power line MP2 may be disposed between the first and second standard cells ST1 and ST2. The third power line MP3 may be disposed between the second standard cell ST2 and the third standard cell ST3. A fourth power line MP4 may be disposed between the third standard cell ST3 and the fourth standard cell ST4. A fifth power line MP5 may be disposed adjacent to the PMOS region PR of the fourth standard cell ST4. A first voltage may be applied to the first, third, and fifth power lines MP1, MP3, and MP5. A second voltage may be applied to the second and fourth power lines MP2 and MP4. One of the first and second voltages may be a power voltage (Vdd), and the other a ground voltage (Vss).

The first line M1 may be disposed between the PMOS and NMOS regions PR and NR of the first standard cell ST1. The first line M1 may be electrically connected to the gate electrode GE through the gate via VB and the gate contact CB. The first dummy gate contact DCB1 may be in contact with the gate electrode GE, between the PMOS and NMOS regions PR and NR of the second standard cell ST2. The second dummy gate contact DCB2 may be in contact with the gate electrode GE, between the PMOS and NMOS regions PR and NR of the third standard cell ST3. A third dummy gate contact DCB3 may be in contact with the gate electrode GE, between the PMOS and NMOS regions PR and NR of the fourth standard cell ST4. FIG. 11 illustrates an example, in which three dummy gate contacts DCB1, DCB2, and DCB3 are provided, but in an embodiment, the semiconductor device 10g may be configured to have one or two dummy gate contacts. In an embodiment, at least one of the dummy gate contacts DCB1, DCB2, and DCB3 may be adjacent to or overlap the PMOS or NMOS region PR or NR of at least one of the first to fourth standard cells ST1-ST4.

Figure 12A:
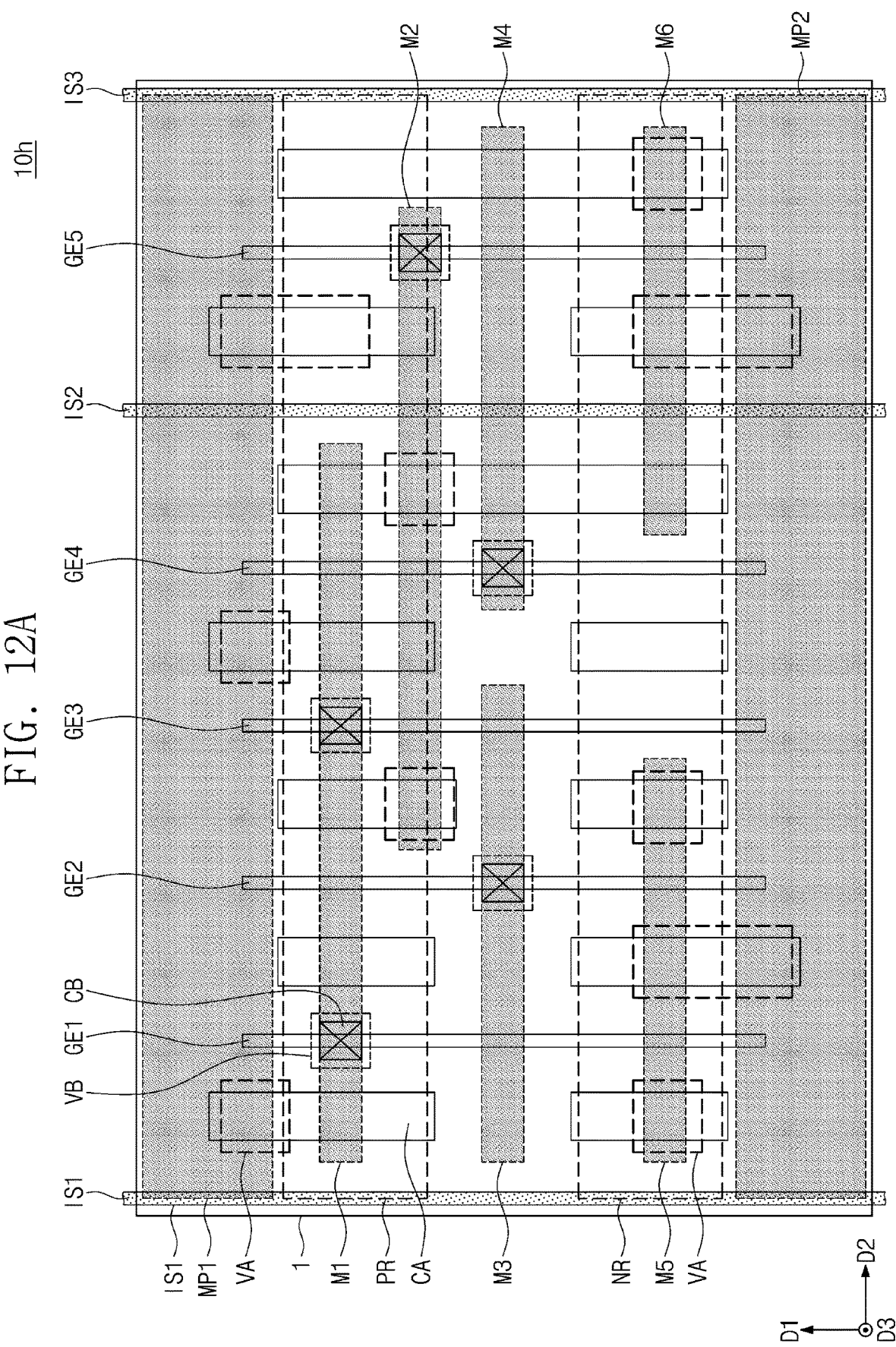
FIGS. 12A to 12C are layouts illustrating a portion (e.g., standard cells) of a semiconductor device according to an embodiment of the inventive concept.
Figure 12B:
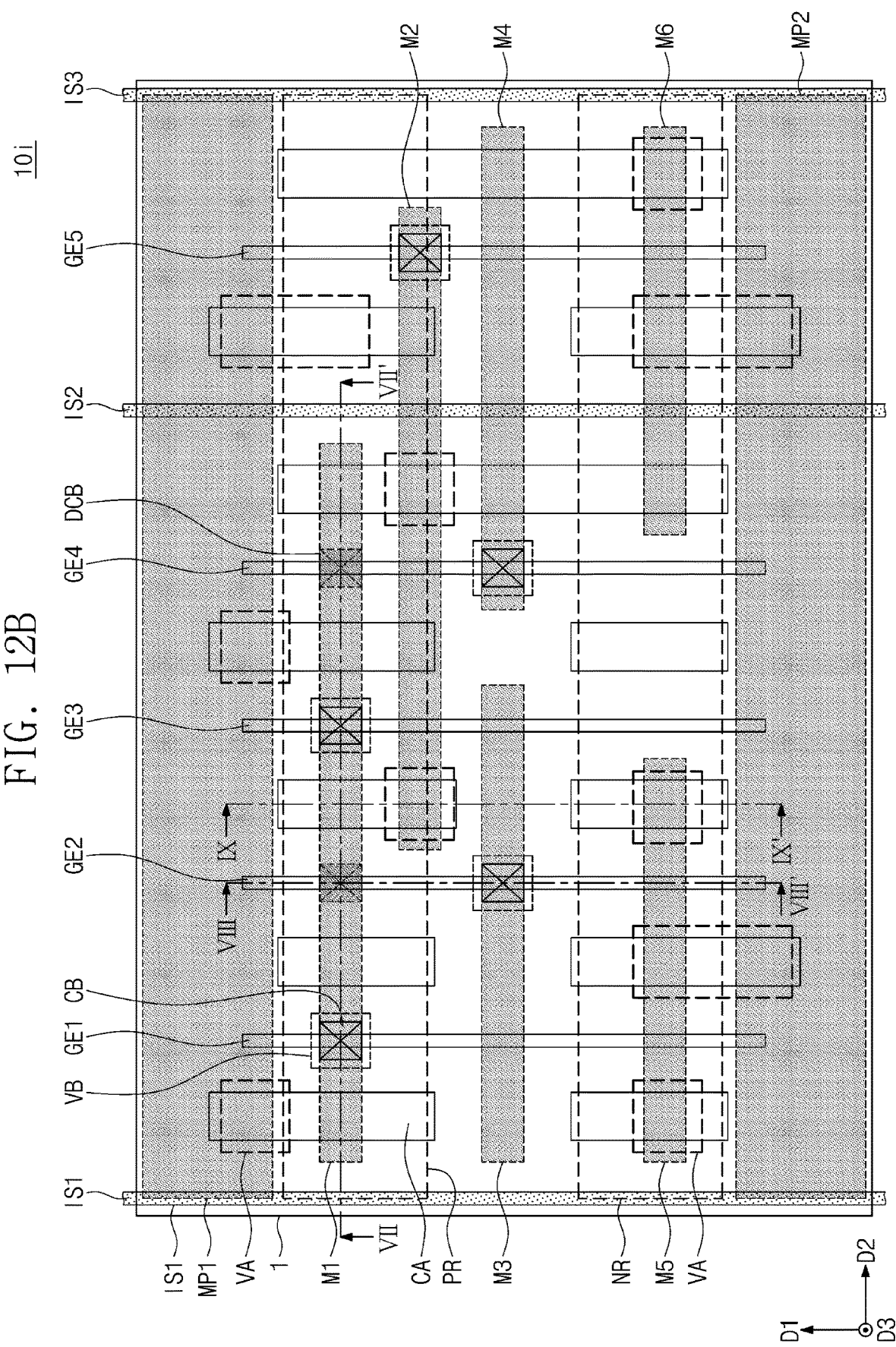
Figure 12C:
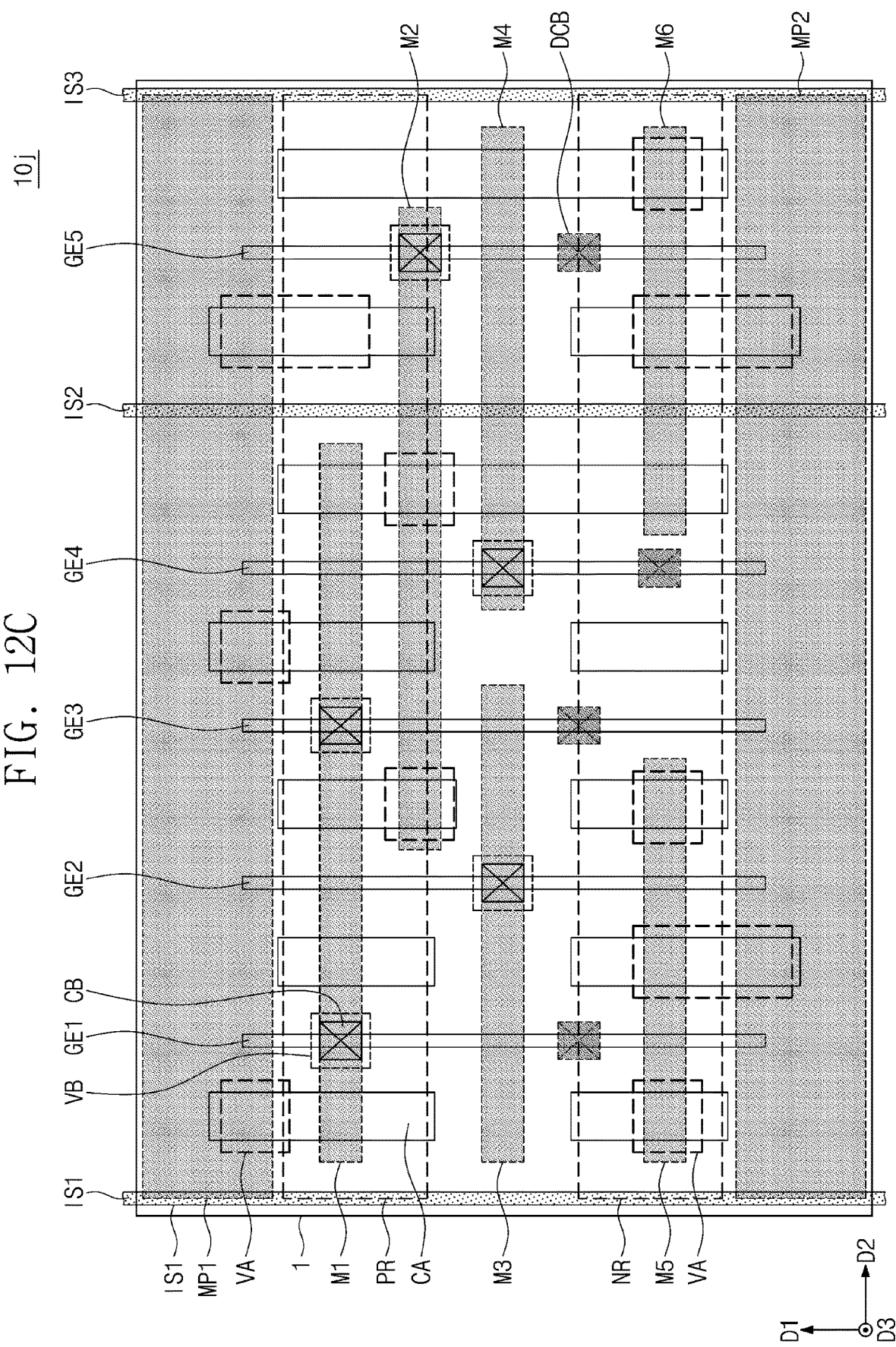

FIGS. 12A to 12C are layouts illustrating a semiconductor device according to an embodiment of the inventive concept. For example, FIGS. 12A to 12C illustrate layouts of standard cells according to an embodiment of the inventive concept.

Referring to FIG. 12A, a semiconductor device 10h may include first to fifth gate electrodes GE1-GE5, which are disposed on the substrate 1 and are spaced apart from each other. Each of the first to fifth gate electrodes GE1-GE5 may be a line-shaped pattern extending in a lengthwise direction (e.g., the first direction D1) and the first to fifth gate electrodes GE1-GE5 may be spaced apart from each other in the second direction D2 different from the first direction D1. First to third insulating isolation patterns IS1-IS3, which are spaced apart from each other, may be disposed on the substrate 1. Each of the first to third insulating isolation patterns IS1-IS3 may be a line-shaped pattern extending in a lengthwise direction (e.g., the first direction D1) and the first to third insulating isolation patterns IS1-IS3 may be spaced apart from each other in the second direction D2. The first insulating isolation pattern IS1 may be spaced apart from the second gate electrode GE2 with the first gate electrode GE1 interposed therebetween. The second insulating isolation pattern IS2 may be disposed between the fourth gate electrode GE4 and the fifth gate electrode GE5. The third insulating isolation pattern IS3 may be spaced apart from the second insulating isolation pattern IS2 with the fifth gate electrode GE5 interposed therebetween.

In an embodiment, a distance between the first gate electrode GE1 and the second gate electrode GE2, a distance between the second gate electrode GE2 and the third gate electrode GE3, a distance between the third gate electrode GE3 and the fourth gate electrode GE4, a distance between the first insulating isolation pattern IS1 and the first gate electrode GE1, a distance between the second insulating isolation pattern IS2 and the fourth gate electrode GE4, a distance between the second insulating isolation pattern IS2 and the fifth gate electrode GE5, and a distance between the third insulating isolation pattern IS3 and the fifth gate electrode GE5 may be the same as each other.

Source/drain contacts CA may be disposed among the first to fifth gate electrodes GE1-GE5. The source/drain contacts CA may have a bar shape elongated in the first direction D1. The first power line MP1 and the second power line MP2 may be spaced apart from each other and may be disposed to cross end portions of the first to fifth gate electrodes GE1-GE5. First to sixth lines M1-M6 may be disposed between the first and second power lines MP1 and MP2.

Some of the source/drain contacts CA may be electrically connected to the lines MP1, MP2, and M1-M6 through source/drain vias VA.

Each of the first to fifth gate electrodes GE1-GE5 may be electrically connected to a corresponding line (i.e., a corresponding interconnection line) through the gate contact CB and the gate via VB. For example, the first gate electrode GE1 may be electrically connected to the first line M1 through the gate contact CB and the gate via VB overlapping the first gate electrode GE1. The third gate electrode GE3 may be electrically connected to the first line M1 through the gate contact CB and the gate via VB overlapping the third gate electrode GE3. The second gate electrode GE2 may be electrically connected to the third line M3 through the gate contact CB and the gate via VB overlapping the second gate electrode GE2. The fourth gate electrode GE4 may be electrically connected to the fourth line M4 through the gate contact CB and the gate via VB overlapping the fourth gate electrode GE4. The fifth gate electrode GE5 may be electrically connected to the second line M2 through the gate contact CB and the gate via VB overlapping the fifth gate electrode GE5.

The dummy gate contact DCB described with reference to FIGS. 3A to 11 may be placed to increase the performance and reliability of the semiconductor device 10h, which has the layout of the standard cell shown in FIG. 12A. For example, the dummy gate contact DCB may be placed in the layout design step S20 of FIG. 2 or in the step S30 of placing and routing standard cells.

The dummy gate contact DCB may be placed on one of the first to fifth gate electrodes GE1-GE5 in the PMOS region PR to increase speed and performance of the transistors. For example, the dummy gate contact DCB may be disposed on the PMOS region PR of the semiconductor device 10h of FIG. 12A. For example, in a semiconductor device 10i according to the present embodiment, the dummy gate contacts DCB may be respectively disposed on the second and fourth gate electrodes GE2 and GE4 in the PMOS region PR, as shown in FIG. 12B. The dummy gate contacts DCB may overlap the first line M1 but may not be electrically connected to the first line M1.

In FIG. 12B, the dummy gate contact DCB may be placed on one of the first to fifth gate electrodes GE1-GE5 in the NMOS region NR to reduce or suppress the leakage current of the semiconductor device 10h of FIG. 12A to increase the reliability of the semiconductor device 10h, although it may reduce the speed of the transistors in the NMOS region NR. For example, in a semiconductor device 10j according to the present embodiment, as shown in FIG. 12C, the dummy gate contacts DCB may be placed in the NMOS region NR or near the boundary of the NMOS region NR to be placed on the first, third, fourth, and fifth gate electrodes GE1, GE3, GE4, and GE5, respectively. The dummy gate contacts DCB may not overlap the first to sixth lines M1-M6.

At least one of the first to sixth lines M1-M6 may be a pin connection line. The pin connection line may be used to receive a signal from the outside of the standard cell. In an embodiment, the pin connection line may be used to output a signal to the outside of the standard cell.

A photomask may be manufactured using layouts of the standard cells of FIGS. 12A to 12C and may be used to fabricate a semiconductor device. An example of a semiconductor device, which is fabricated on a substrate using the layout of the standard cell shown in FIG. 12B, will be described in more detail below.

Figure 13A:
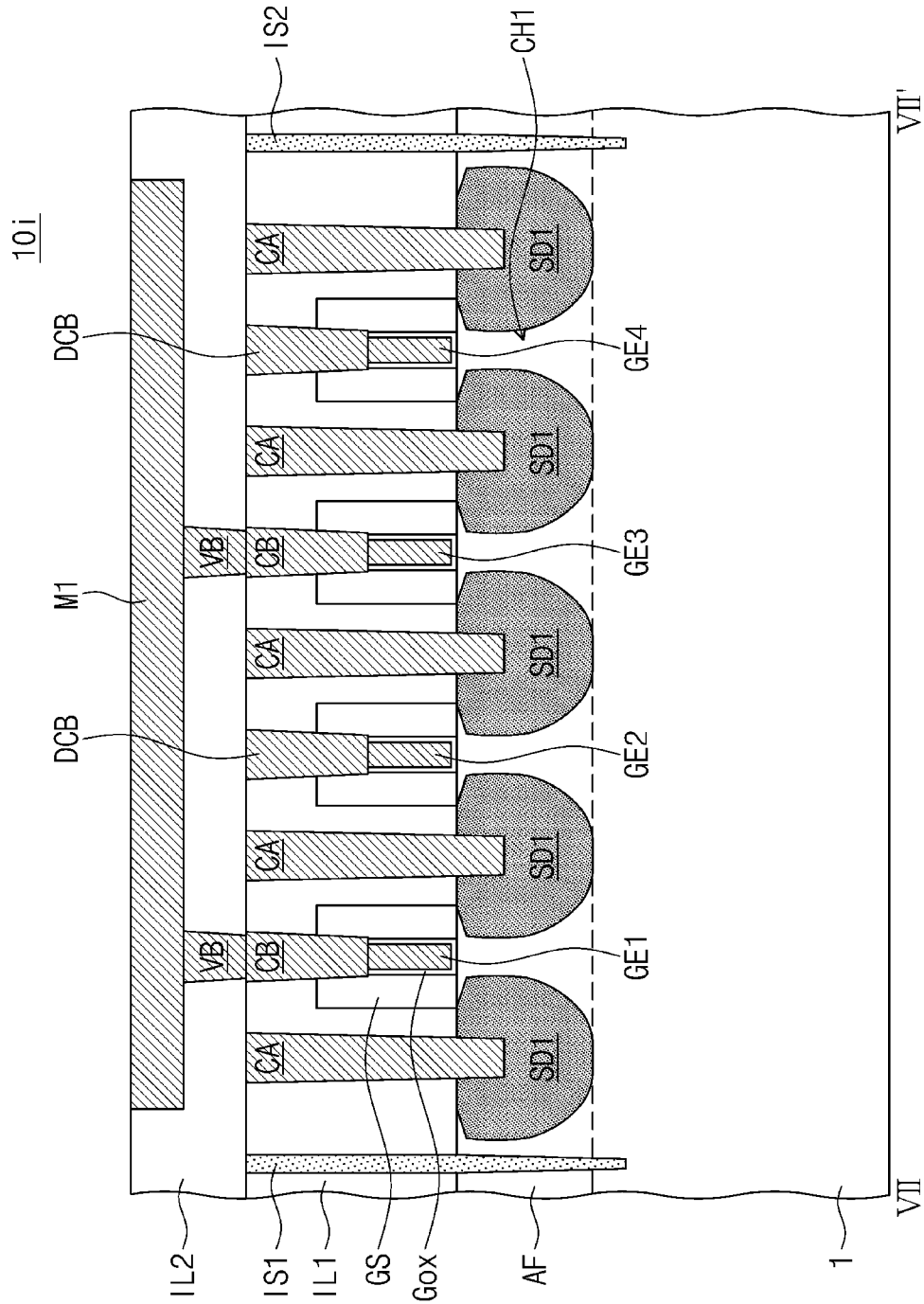
FIGS. 13A, 13B, and 13C are sectional views taken along lines VII-VII', VIII-VIII', and IX-IX', respectively, of FIG. 12B.
Figure 13B:
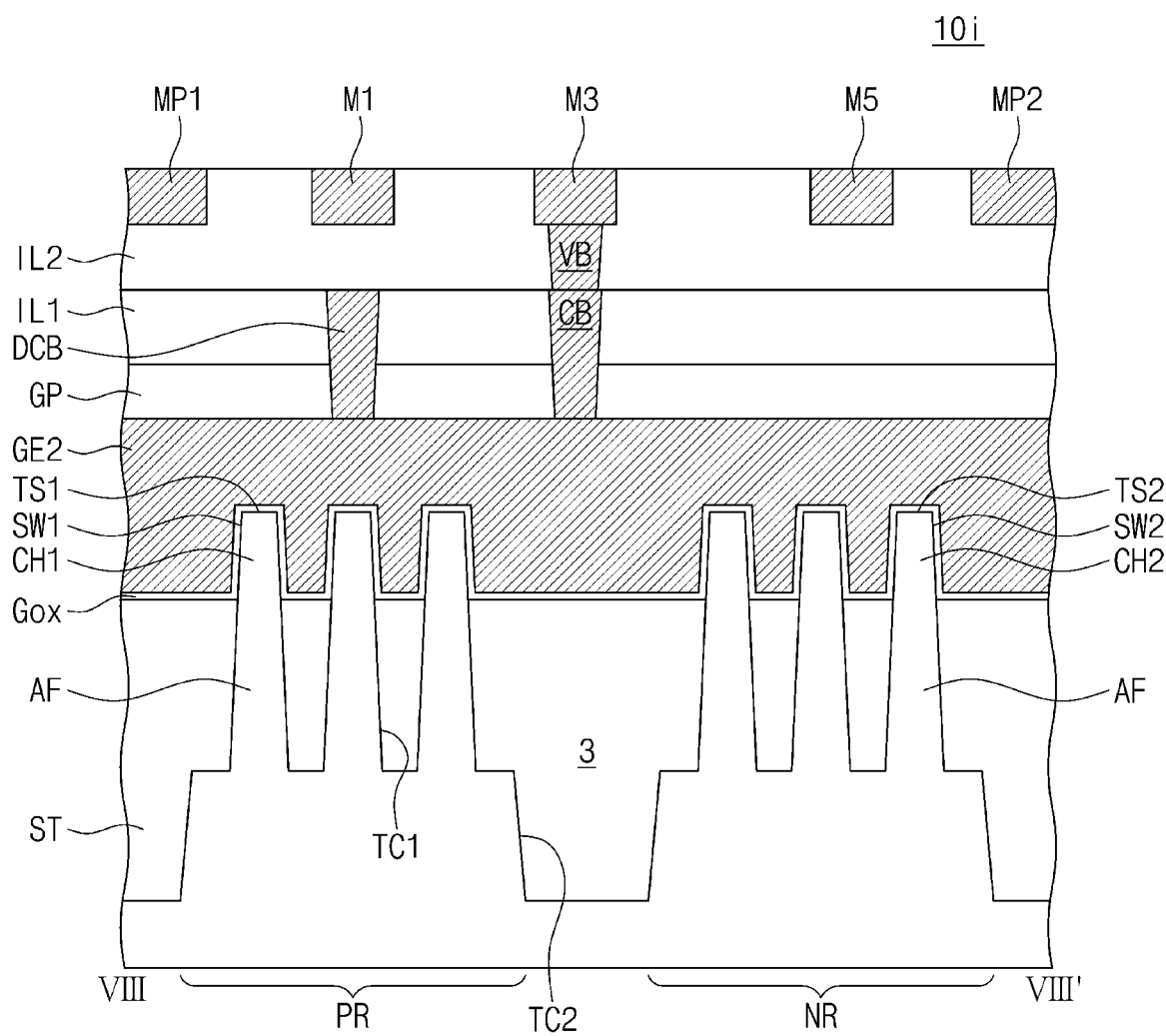
Figure 13C:
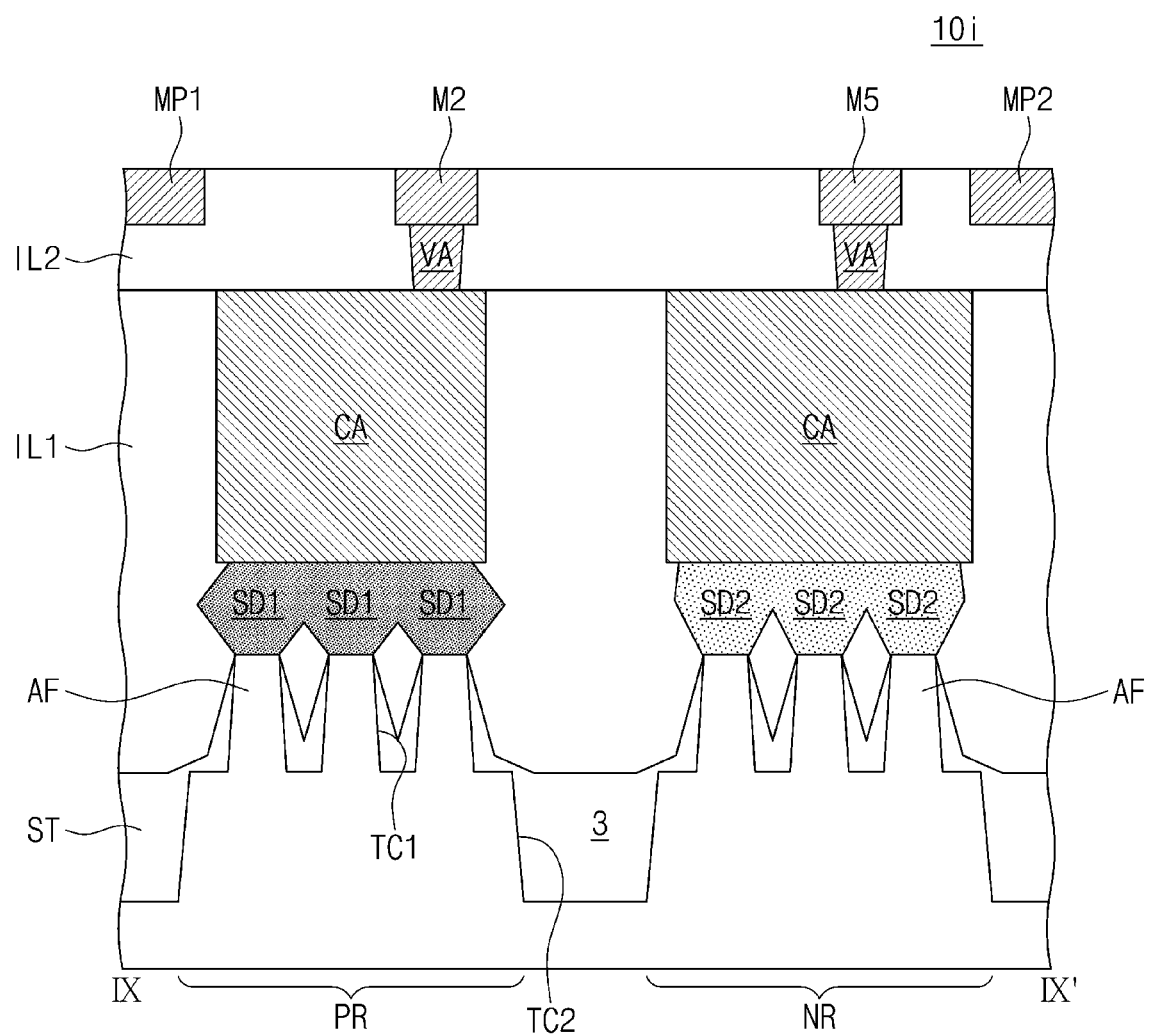

FIGS. 13A, 13B, and 13C are sectional views taken along lines VII-VII', VIII-VIII', and IX-IX', respectively, of FIG.

12B. The semiconductor device 10i of FIGS. 13A, 13B, and 13C may correspond to an example of the FinFET.

Referring to FIGS. 12B, 13A, 13B, and 13C, the substrate 1 may include the PMOS and NMOS regions PR and NR. The PMOS and NMOS regions PR and NR may be defined by a second trench TC2, which is formed in an upper portion of the substrate 1. The second trench TC2 may be located between the PMOS and NMOS regions PR and NR. The PMOS and NMOS regions PR and NR may be spaced apart from each other with the second trench TC2 interposed therebetween in the first direction D1.

A plurality of active fins AF may be provided in each of the PMOS and NMOS regions PR and NR. The active fins AF may be extended in a second direction D2 to be parallel to each other. The active fins AF may be vertically protruding portions of the substrate 1. A first trench TC1 may define the active fins AF. In certain embodiments, the first trench TC1 may surround a lower portion of each of the active fins AF. The first trench TC1 may be shallower than the second trench TC2. For example, a bottom surface of the first trench TC1 may be higher than a bottom surface of the second trench TC2.

The device isolation layer 3 may fill the first and second trenches TR1 and TR2. The device isolation layer 3 may include a silicon oxide layer. Upper portions of the active fins AF may protrude vertically above the device isolation layer 3. The device isolation layer 3 may not cover upper side surfaces of the active fins AF. The device isolation layer 3 may cover lower side surfaces of the active fins AF. The first to fifth gate electrodes GE1-GE5 may be disposed to cross the active fins AF. The gate insulating layer Gox may be interposed between the first to fifth gate electrodes GE1-GE5 and the active fins AF.

Each of the active fins AF on the PMOS region PR may include a first top surface TS1 and first side surfaces SW1. Each of the first to fifth gate electrodes GE1-GE5 may cover the first top surfaces TS1 and the first side surfaces SW1. First channel regions CH1 may be disposed in upper portions of the active fins AF. The first channel regions CH1 may correspond to the upper portions of the active fins AF that respectively overlap the first to fifth gate electrodes GE1-GE5 in the PMOS region PR. First source/drain patterns SD1 may be provided on the active fins AF. In certain embodiment, the first source/drain patterns SD1 may be located on opposite sides of each of the first to fifth gate electrodes GE1-GE5 in the PMOS region PR. The first source/drain patterns SD1 may be formed of or include a semiconductor material (e.g., SiGe), whose lattice constant is larger than that of a semiconductor material constituting the substrate 1. The first source/drain patterns SD1 may exert on a compressive stress on the first channel regions CH1. The first source/drain patterns SD1 may be doped with p-type impurities (e.g., boron).

Each of the active fins AF in the NMOS region NR may include a second top surface TS2 and second side surfaces SW2. Each of the first to fifth gate electrodes GE1-GE5 may be provided to cover the second top surfaces TS2 and the second side surfaces SW2. Second channel regions CH2 may be disposed in upper portions of the active fins AF. The second channel regions CH2 may correspond to the upper portions of the active fins AF that respectively overlap the first to fifth gate electrodes GE1-GE5 in the NMOS region NR. Second source/drain patterns SD2 may be provided on portions of the active fins AF. In certain embodiment, the second source/drain patterns SD2 may be located on opposite sides of each of the first to fifth gate electrodes GE1-GE5 in the NMOS region NR. The second source/drain patterns SD2 may be semiconductor epitaxial patterns. As an example, the second source/drain patterns SD2 may be formed of or include the same semiconductor material (e.g., Si) as the substrate 1. The second source/drain patterns SD2 may be doped with n-type impurities (e.g., phosphorus or arsenic).

As shown in FIG. 13A, each of the first and second insulating isolation patterns IS1 and IS2 may be provided to penetrate the first interlayered insulating layer IL1 and the active fin AF and may be extended into the substrate 1. The first and second insulating isolation patterns IS1 and IS2 may be formed of or include at least one of silicon oxide, silicon nitride, and silicon oxynitride.

As shown in FIG. 13B, the gate contact CB may be provided to penetrate the first interlayered insulating layer IL1 and the gate capping pattern GP and to be in contact with the second gate electrode GE2. The gate contact CB may be disposed between the PMOS and NMOS regions PR and NR and may overlap the device isolation layer 3. The gate contact CB may be electrically connected to the third line M3 through the gate via VB. The dummy gate contact DCB may be provided to penetrate the first interlayered insulating layer IL1 and the gate capping pattern GP and to be in contact with the second gate electrode GE2. The dummy gate contact DCB may overlap at least one of the active fins AF in the PMOS region PR. For the simplicity of drawings, it is assumed that the PMOS region has three active fins AF, and one of the three active fins AF and the dummy gate contact DCB overlap each other. In an embodiment, the PMOS region may include more than three active fins or less than three active fins. In an embodiment, the dummy gate contact DCB may overlap two or more active fins. In an embodiment, the dummy gate contact DCB may be disposed to overlap a portion of the active fin AF in the PMOS region PR.

As shown in FIG. 13C, the first source/drain patterns SD1 may be in contact with each other. The second source/drain patterns SD2 may also be in contact with each other. The first source/drain patterns SD1 may be electrically connected to the second line M2 through the source/drain contact CA and the source/drain via VA. The second source/drain patterns SD2 may be electrically connected to a fifth line M5 through the source/drain contact CA and the source/drain via VA.

Figure 14A:
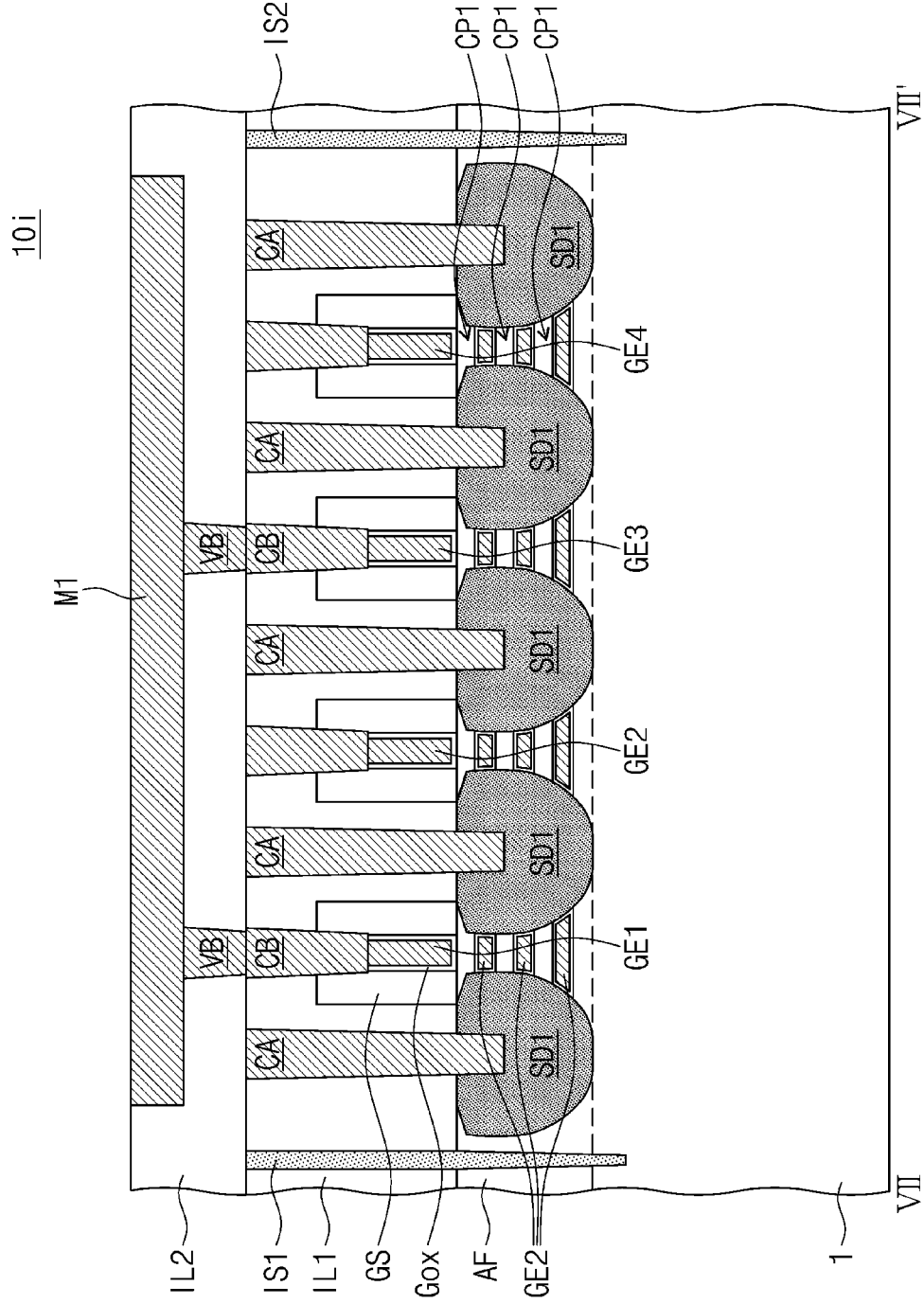
FIGS. 14A, 14B, and 14C are sectional views taken along lines VII-VII', VIII-VIII', and IX-IX', respectively, of FIG. 12B.
Figure 14B:
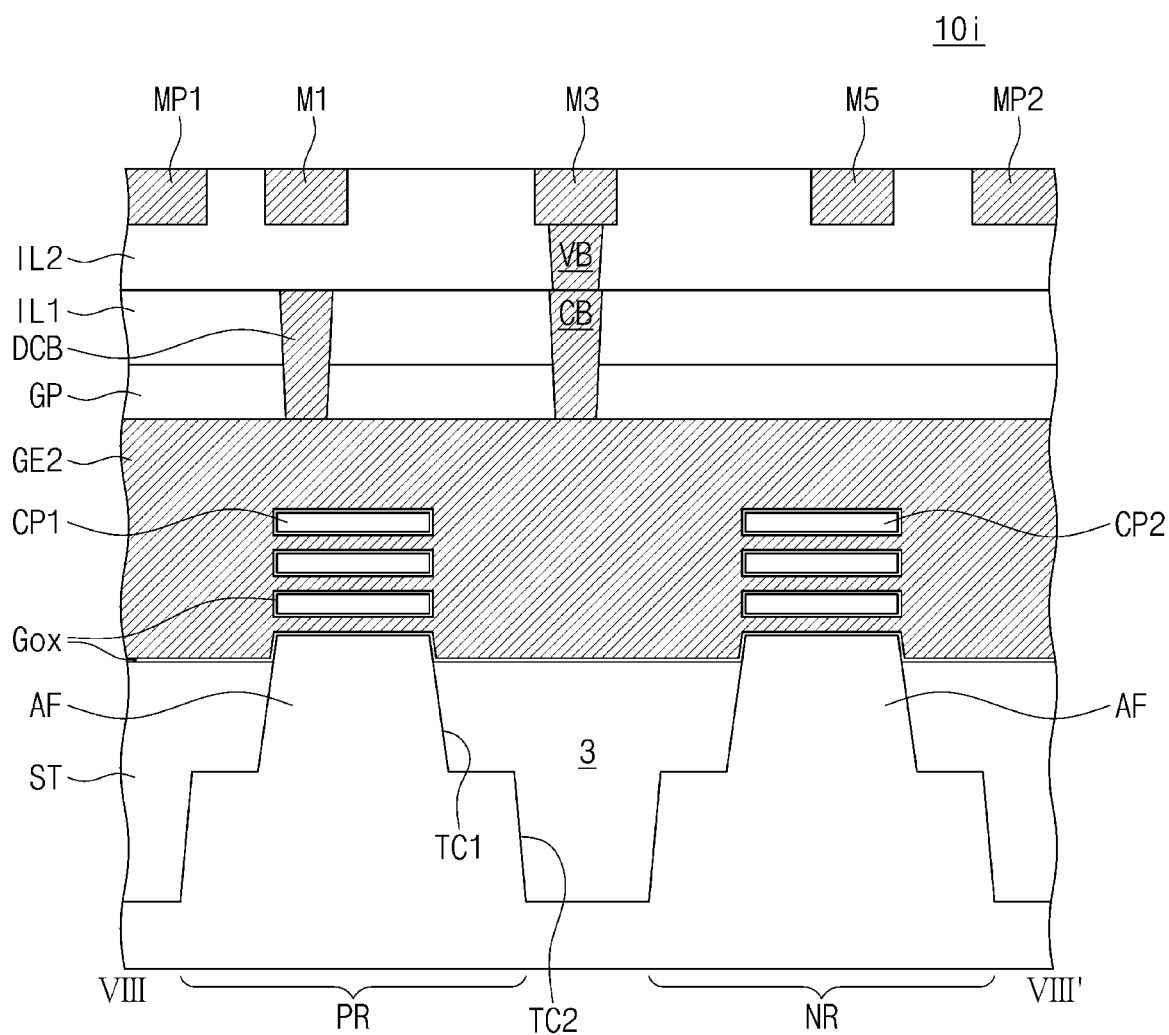
Figure 14C:
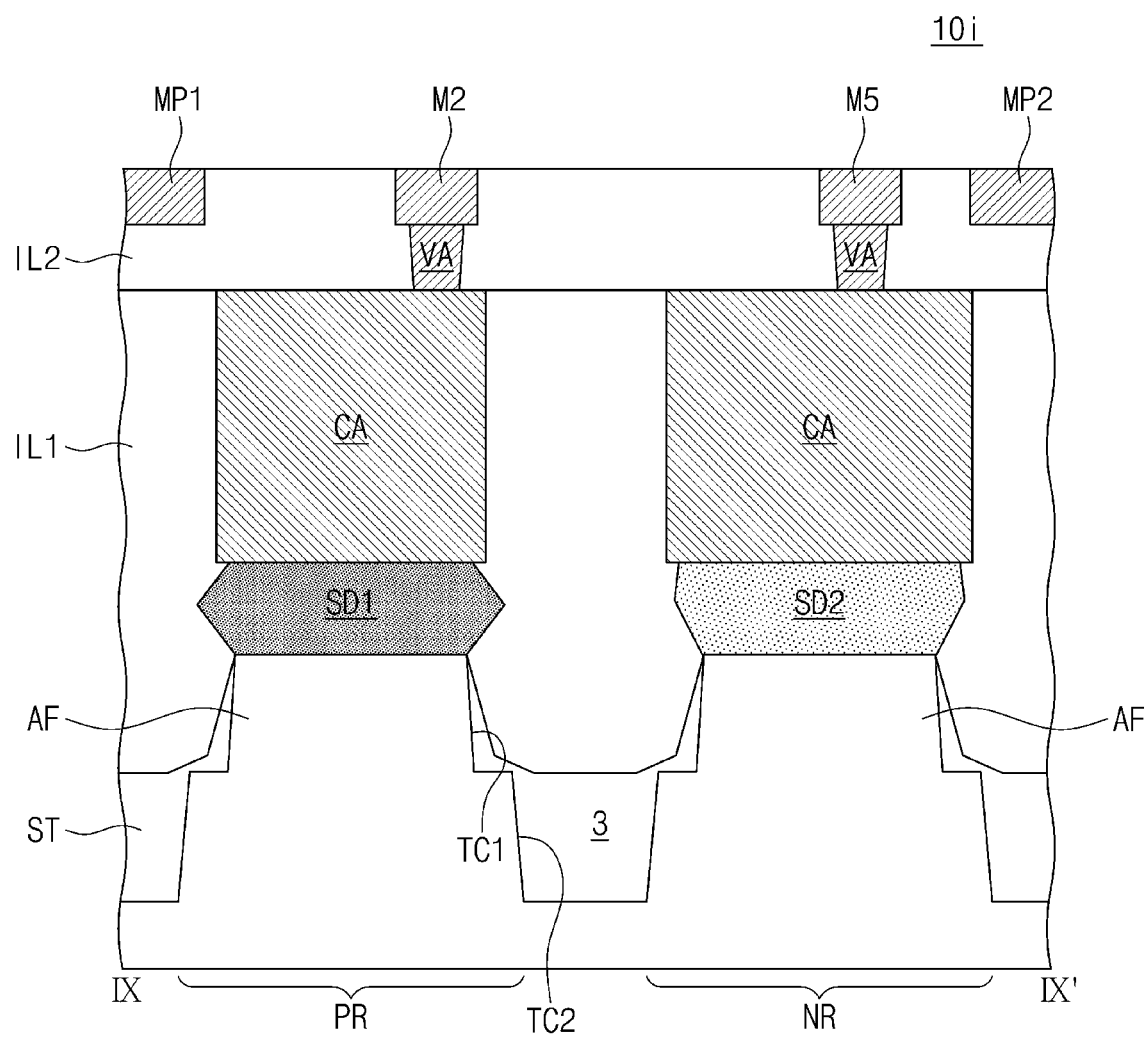

FIGS. 14A, 14B, and 14C are sectional views taken along lines VII-VII', VIII-VIII', and IX-IX', respectively, of FIG. 12B. A semiconductor device 10i of FIGS. 14A, 14B, and 14C may correspond to an example of the MBCFET.

Referring to FIGS. 14A, 14B, and 14C, the semiconductor device 10i may include a single active fin AF in each of the PMOS and NMOS regions PR and NR. In the PMOS region PR, first channel patterns CP1 may be stacked on the active fin AF. The first channel patterns CP1 may be spaced apart from each other. In the NMOS region NR, second channel patterns CP2 may be stacked on the active fin AF. The second channel patterns CP2 may be spaced apart from each other. The second gate electrode GE2 may be extended into regions between the first channel patterns CP1 and between the second channel patterns CP2. Except for the aforementioned differences, the semiconductor device according to the present embodiment may have substantially the same features as that described with reference to FIGS. 13A to 13C. For the simplicity of a drawing, FIG. 14B includes a single active fin AF in each of the PMOS and NMOS regions PR and NR. In an embodiment, at least two or more fins may be disposed in each of the PMOS and NMOS regions PR and NR.

Figure 15A:
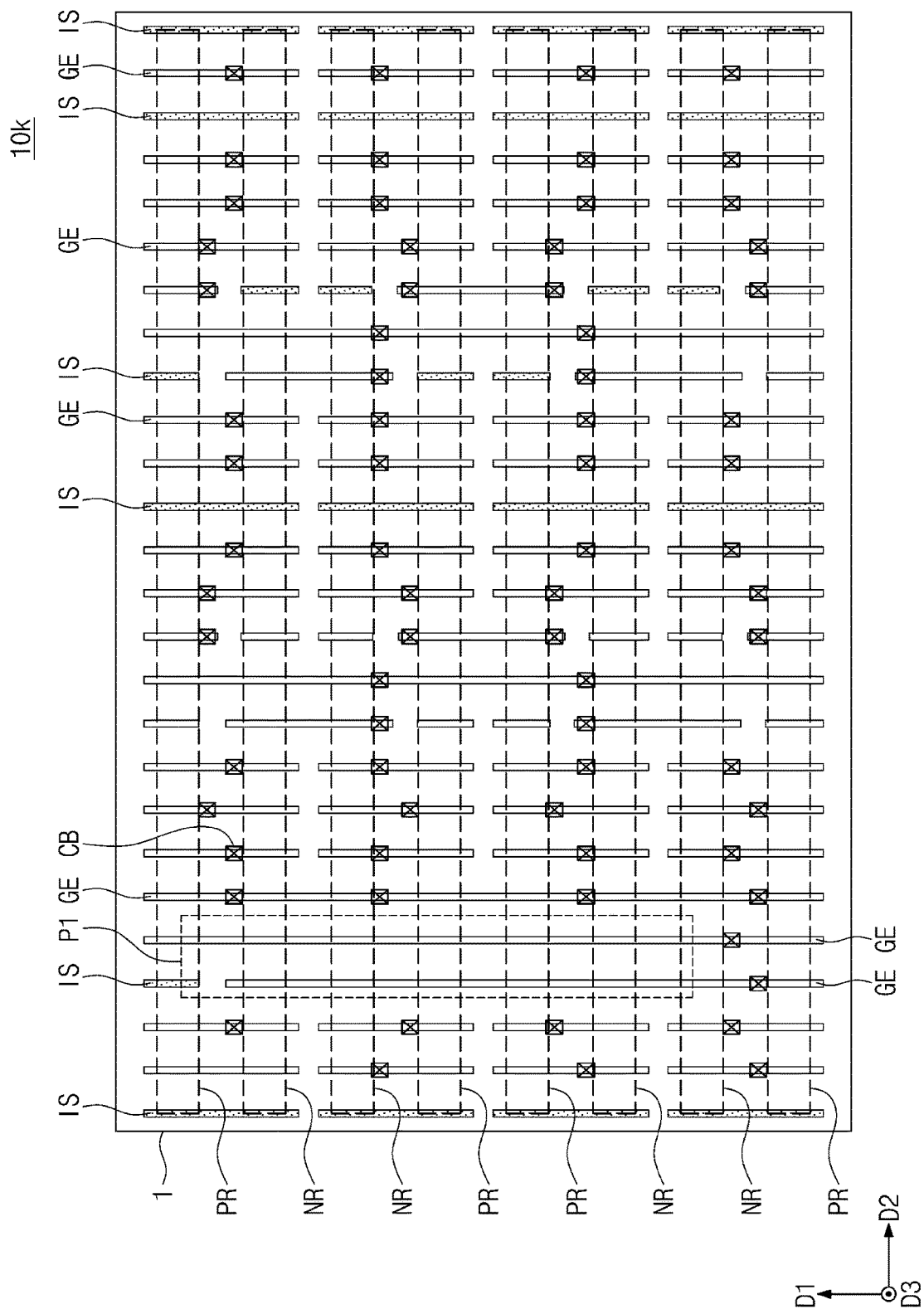

FIGS. 15A and 15B are layouts illustrating a semiconductor device according to an embodiment of the inventive concept.

Referring to FIG. 15A, the substrate 1 may include PMOS regions PR and NMOS regions NR, which are spaced apart from each other. Each pair of the PMOS and NMOS regions PR and NR adjacent to each other may be disposed to be symmetric to each other. The gate electrodes GE may be disposed to cross the PMOS and NMOS regions PR and NR. Although not shown, the gate separation pattern IP described with reference to FIGS. 7 and 8 may be interposed between two gate electrodes GE adjacent to each other in the first direction D1. The two gate electrodes GE may be spaced apart from each other in the first direction D1 with the gate separation pattern IP therebetween. Insulating isolation patterns IS may be sparsely distributed on the substrate to be interposed between the gate electrodes GE. For convenience in illustration, interconnection lines, source/drain contacts, and source/drain vias are omitted in FIG. 15A. The gate contacts CB may be disposed at appropriate positions on the gate electrodes GE. The gate contacts CB may be used to apply a voltage to the gate electrodes GE.

However, as shown in a specific region P1, the gate contacts CB may be disposed near end portions of the gate electrodes GE extending in the first direction D1 through the specific region P1. No gate contacts may be disposed in the specific region P1. The dummy gate contact DCB, as shown in FIG. 15B, may be disposed in the specific region P1 to increase performance and reliability of some transistors in the specific region P1. The dummy gate contact DCB may be in contact with the gate electrodes GE of some transistors in the specific region P1.

Referring to FIG. 15B, the dummy gate contacts DCB may be disposed in the specific region P1 and on the gate electrodes GE. The dummy gate contacts DCB may not be used to apply a voltage to an element. Each of the dummy gate contacts DCB may be disposed adjacent to the PMOS or NMOS region PR or NR. Each of the dummy gate contacts DCB may be in contact with a boundary of the PMOS region PR or the NMOS region NR in a top down view. In an embodiment, each of the dummy gate contacts DCB may partially overlap the PMOS region PR or the NMOS region NR in a top down view.

Figure 16:
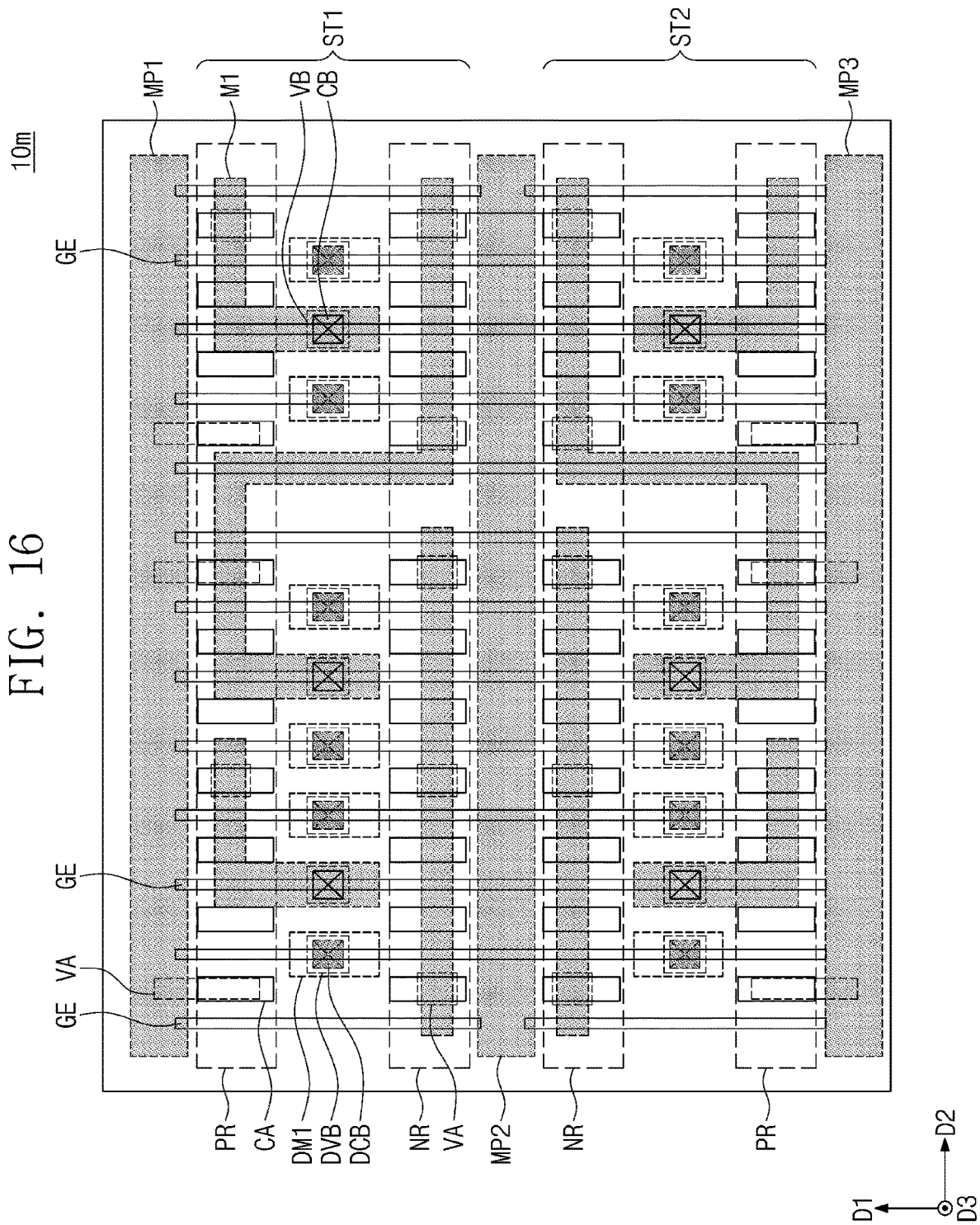
FIG. 16 is a layout illustrating a semiconductor device according to an embodiment of the inventive concept.

FIG. 16 is a layout illustrating a semiconductor device according to an embodiment of the inventive concept.

Referring to FIG. 16, a semiconductor device 10m according to the present embodiment may include the first standard cell ST1 and the second standard cell ST2, which are disposed on the substrate 1 to be adjacent to each other in the first direction D1. Each of the first and second standard cells ST1 and ST2 may include a pair of the PMOS and NMOS regions PR and NR. The gate electrodes GE may be disposed to cross the PMOS and NMOS regions PR and NR. The first power line MP1 may be disposed adjacent to the first standard cell ST1. The second power line MP2 may be provided between the first and second standard cells ST1 and ST2. The third power line MP3 may be disposed adjacent to the second standard cell ST2. The first to third power lines MP1-MP3 may be substantially the same or similar features as those described with reference to FIG. 9. Some of the source/drain contacts CA may be electrically connected to the first power line MP1 or the third power line MP3 through the source/drain vias VA.

The gate contacts CB may be disposed on at least some of the gate electrodes GE and may be electrically connected to the first lines M1 through the gate vias VB. The dummy gate contacts DCB may be disposed on at least some of the gate electrodes GE. In the present embodiment, the dummy gate contacts DCB may be located between the PMOS region PR and the NMOS region NR. The dummy gate contacts DCB may be connected to the dummy line DM1 through the dummy gate via DVB. The dummy line DM1 may not be electrically connected to other lines except for a gate electrode. Except for these differences, the semiconductor device according to the present embodiment may have the same or similar as that in the previous embodiments.

Figure 17:
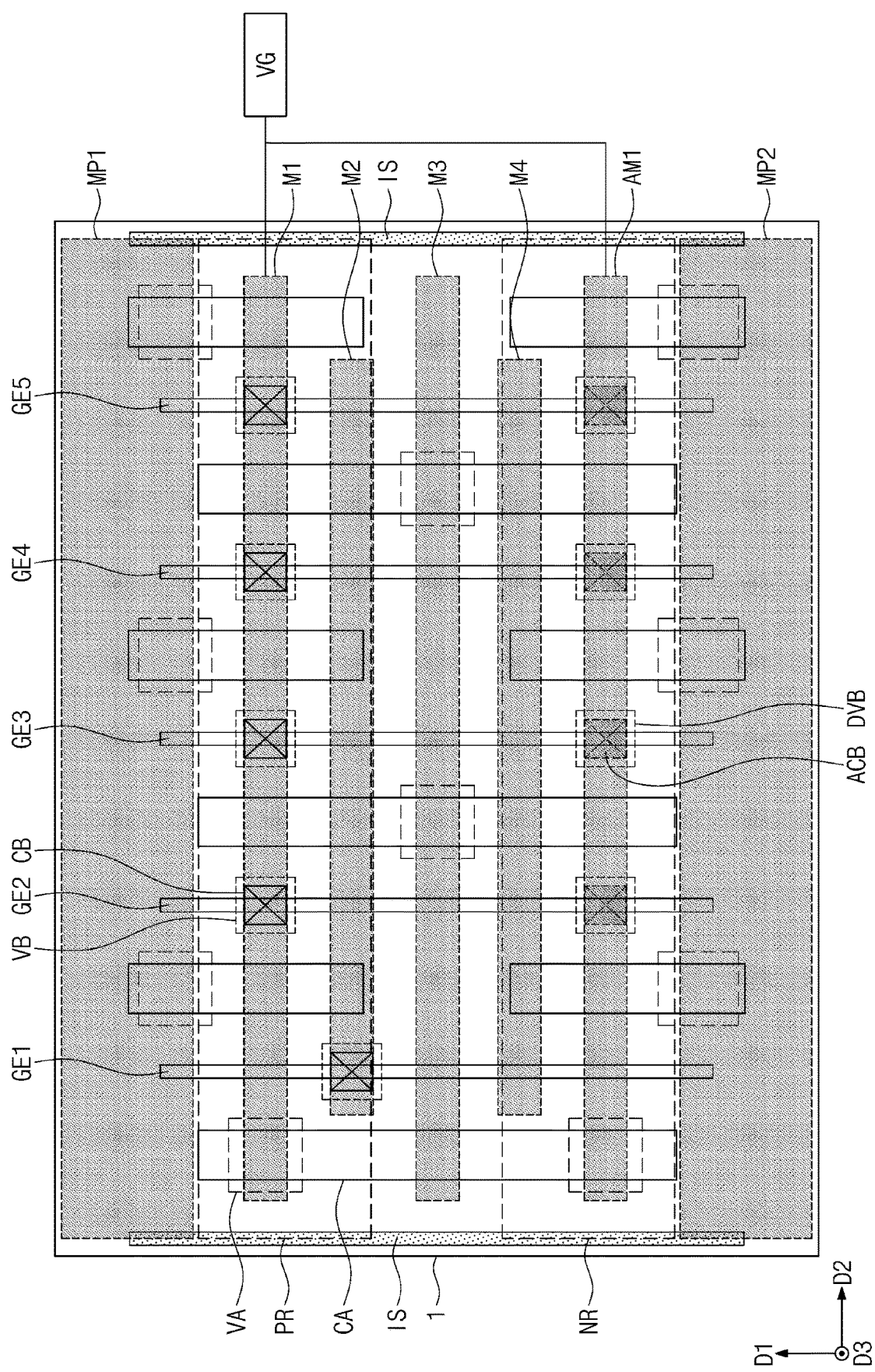
FIG. 17 is a layout illustrating a semiconductor device according to an embodiment of the inventive concept.

FIG. 17 is a layout illustrating a semiconductor device according to an embodiment of the inventive concept. FIG. 17 may be a layout of a single standard cell.

Referring to FIG. 17, a semiconductor device 10n may include the substrate 1. The PMOS region PR and the NMOS region NR may be disposed in the substrate 1. The insulating isolation patterns IS may be disposed on the substrate 1 to be spaced apart from each other. The first to fifth gate electrodes GE1-GE5 may be disposed between the insulating isolation patterns IS to be spaced apart from each other in the second direction D2. The source/drain contacts CA may be disposed among the first to fifth gate electrodes GE1-GE5. The first power line MP1 may be disposed on end portions of the first to fifth gate electrodes GE1-GE5. The second power line MP2 may be disposed on other end portions of the first to fifth gate electrodes GE1-GE5. The first to fourth lines M1-M4 may be disposed between the first and second power lines MP1 and MP2 to be spaced apart from each other in the first direction D1. The dummy line DM1 may be disposed between the fourth line M4 and the second power line MP2.

In the PMOS region PR, the gate contacts CB may be disposed on the second to fifth gate electrodes GE2-GE5, respectively. The gate contacts CB may be electrically connected to the first line M1 by the gate via VB. The first line M1 may be electrically connected to the source/drain contact CA, which is adjacent to one side of the first gate electrode GE1, through the source/drain via VA. A plurality of auxiliary gate contacts ACB may be disposed in the NMOS region NR and on the second to fifth gate electrodes GE2-GE5, respectively. The auxiliary gate contacts ACB may be electrically connected to an auxiliary line (i.e., an auxiliary interconnect line) AM1 through the auxiliary gate via AVB. The auxiliary line AM1 may be electrically connected with the first line M1 and may be applied with the same electrical signal as that in the first line M1. For example, a voltage generator VG may generate a first voltage and apply the first voltage to the first line M1 and the auxiliary line AM1. An electrical connection among the voltage generator VG, the first line M1 and the auxiliary line AM1 may be made using interconnect lines positioned at the same level as the first line M1 or positioned at a higher level. For the simplicity of drawings, such electrical connection among the voltage generator VG, the first line M1 and the auxiliary line AM1 may be omitted.

Figure 18:
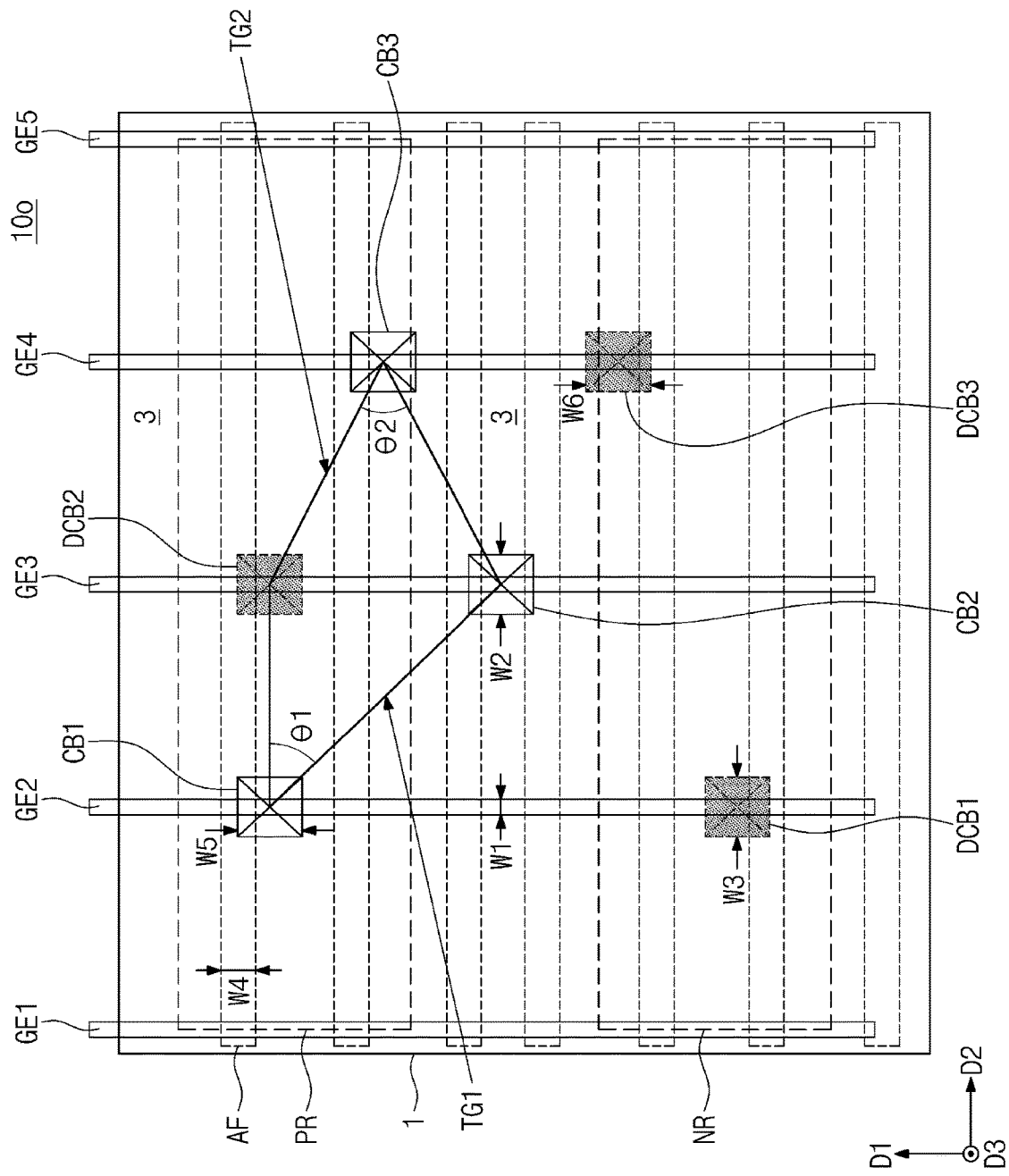
FIG. 18 is a layout illustrating a semiconductor device according to an embodiment of the inventive concept.

FIG. 18 is a layout illustrating a semiconductor device according to an embodiment of the inventive concept.

Referring to FIG. 18, the semiconductor device 10o according to the present embodiment may include the substrate 1, in which the PMOS region PR and the NMOS region NR are provided. Two active fins AF may be disposed in each of the PMOS and NMOS regions PR and NR. Two active fins AF may also be disposed between the PMOS region PR and the NMOS region NR. In some embodiments, the two fins disposed between the PMOS region PR and the NMOS region NR may be dummy fins. The active fins AF may be spaced apart from each other in the first direction and may be extended in the second direction D2. The first to fifth gate electrodes GE1-GE5 may be extended in the first direction D1 to cross the active fins AF. The first to fifth gate electrodes GE1-GE5 may be spaced apart, in the second direction D2, from each other by the same distance. Each of the first to fifth gate electrodes GE1-GE5 may have a first width W1, when measured in the second direction D2.

One of the gate contacts CB1-CB3 and one of the dummy gate contacts DCB1-DCB3 may be disposed on each of the second to fourth gate electrodes GE2-GE4. Each of the gate contacts CB1-CB3 may have a second width W2, when measured in the second direction D2. Each of the dummy gate contacts DCB1-DCB3 may have a third width W3, when measured in the second direction D2. The second width W2 may be equal to the third width W3. The second width W2 may be greater than the first width W1 of each of the gate electrodes GE1-GE5. In an embodiment, the second width W2 may be about 3-5 times the first width W1. For example, the first width W1 may be about 4 nm, and the second width W2 may be about 16 nm. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Each of the active fins AF may have a fourth width W4, when measured in the first direction D1. Each of the gate contacts CB1-CB3 may have a fifth width W5, when measured in the first direction D1. Each of the dummy gate contacts DCB1-DCB3 may have a sixth width W6, when measured in the first direction D1. The fifth width W5 may be equal to the sixth width W6. The fifth width W5 may be greater than the fourth width W4. In an embodiment, the fifth width W5 may be about 1.5-2.5 times the fourth width W4. For example, the fourth width W4 may be about 8 nm, and the fifth width W5 may be about 16 nm.

The gate contacts CB1-CB3 may overlap portions of the active fins AF. The dummy gate contacts DCB1-DCB3 may overlap portions of the active fins AF. The first gate contact CB1 may be disposed on the PMOS region PR and on the second gate electrode GE2. The second gate contact CB2 may be disposed between the PMOS and NMOS regions PR and NR and on the second gate electrode GE2. The third gate contact CB3 may be disposed adjacent to a boundary of the PMOS region PR and on the fourth gate electrode GE4. The second dummy gate contact DCB2 may be disposed on the PMOS region PR and on the third gate electrode GE3.

The first gate contact CB1, the second gate contact CB2, and the second dummy gate contact DCB2 may be disposed to have centers, which are respectively located at vertices of a triangle (hereinafter, a first triangle TG1). In an embodiment, the first triangle TG1 may be a right-angled triangle. The first triangle TG1 may have a first angle θ1 at the center of the first gate contact CB1. In an embodiment, the first angle θ1 may be an angle between about 30 and about 50°.

The third gate contact CB3, the second gate contact CB2, and the second dummy gate contact DCB2 may be disposed to have centers, which are respectively located at vertices of a triangle (hereinafter, a second triangle TG2). In an embodiment, the second triangle TG2 may be an equilateral isosceles triangle. The second triangle TG2 may have a second angle θ2 at the center of the third gate contact CB3. The second angle θ2 may be an angle between about 30 and about 50°.

Figure 19:
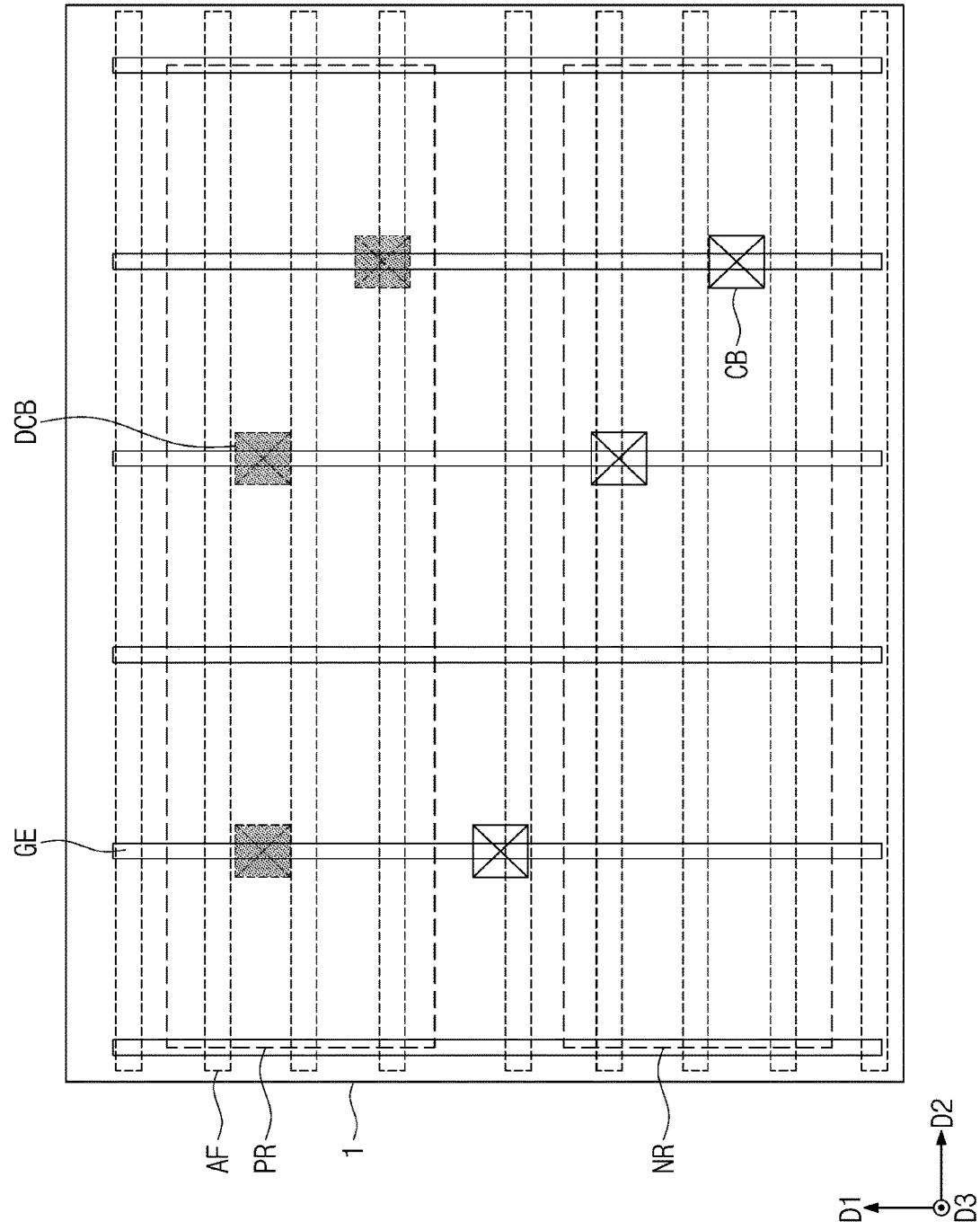
FIG. 19 is a layout illustrating a semiconductor device according to an embodiment of the inventive concept.

FIG. 19 is a layout illustrating a semiconductor device according to an embodiment of the inventive concept.

Referring to FIG. 19, a semiconductor device 10p according to the present embodiment may include the substrate 1, in which the PMOS region PR and the NMOS region NR are provided. Three active fins AF may be disposed in each of the PMOS and NMOS regions PR and NR. One active fin AF may be disposed between the PMOS and NMOS regions PR and NR. The gate electrodes GE may be disposed to cross the active fins AF. The gate contacts CB and the dummy gate contacts DCB may be disposed on the gate electrodes GE. Each of the dummy gate contacts DCB may be disposed between the active fins AF or may overlap at least a portion of the active fin AF. Except for the aforementioned differences, the semiconductor device according to the present embodiment may have substantially the same features as that described with reference to FIG. 18.

Figure 20:
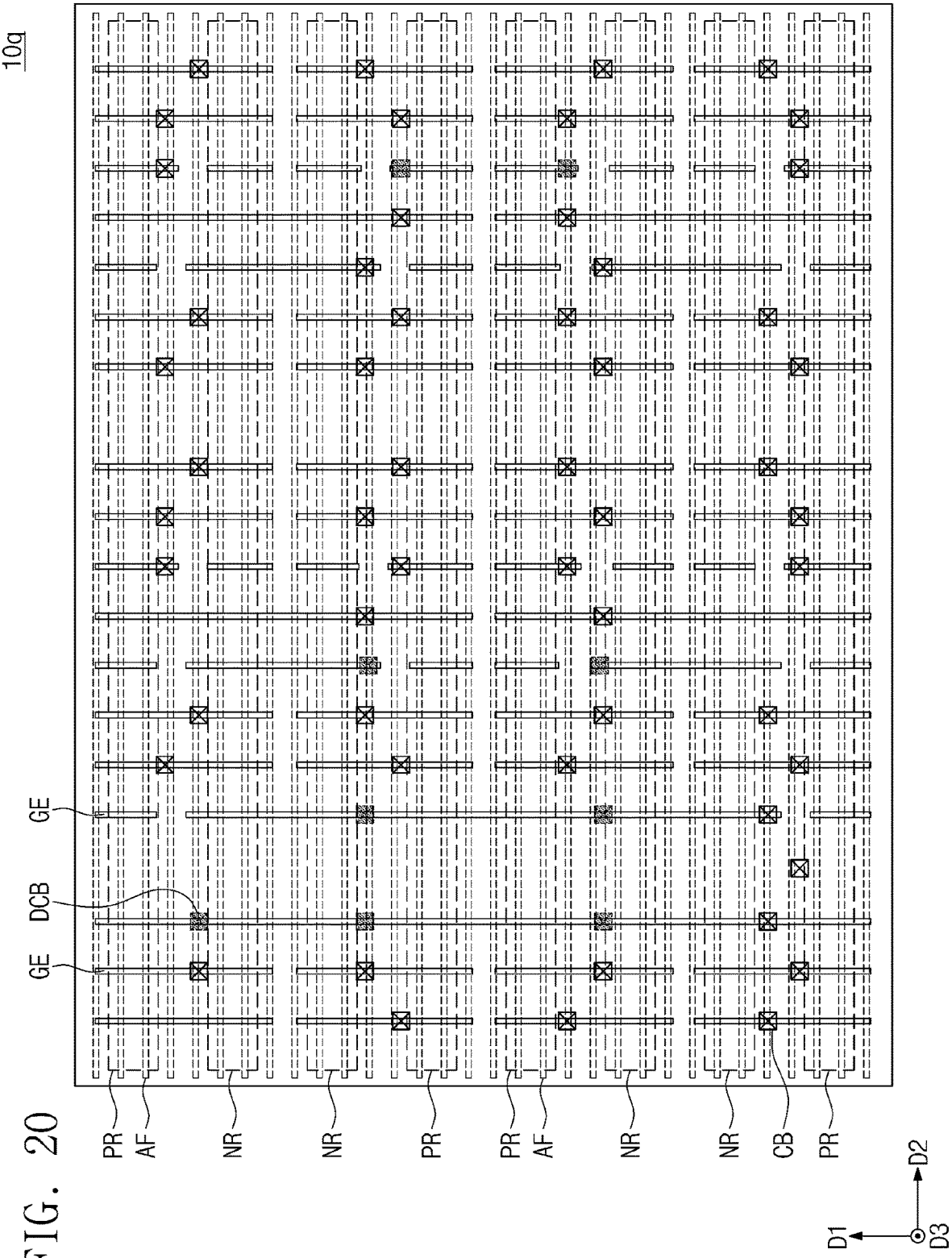
FIG. 20 is a layout illustrating a semiconductor device according to an embodiment of the inventive concept.

FIG. 20 is a layout illustrating a semiconductor device according to an embodiment of the inventive concept.

Referring to FIG. 20, a semiconductor device 10q according to the present embodiment may include the substrate 1, in which the PMOS regions PR and the NMOS regions NR are provided. Two active fins AF may be disposed in each of the PMOS regions PR and the NMOS regions NR. Two active fins AF may be disposed between the PMOS region and NMOS region NR adjacent to each other in the first direction. The gate electrodes GE may be disposed to cross the active fins AF. The gate contact CB and the dummy gate contact DCB may be disposed on the gate electrodes GE. Each of the dummy gate contacts DCB may be disposed between two active fins AF or may overlap at least a portion of the active fin AF. A width of the active fin AF measured in the first direction D1 may be about 5 nm. Each of the dummy gate contacts DCB may be adjacent to a boundary of the NMOS or PMOS region NR or PR. Except for the afore-described differences, the semiconductor device according to the present embodiment may have substantially the same features as that described with reference to FIG. 18.

According to an embodiment of the inventive concept, a semiconductor device may include a dummy gate contact, which improve signal speed or performance of the semiconductor device. Furthermore, the dummy gate contact may be used to suppress a leakage current, and this makes it possible to improve the reliability of the semiconductor device.

While an embodiment of the inventive concepts have been particularly shown and described, it will be understood by one of ordinary skill in the art that variations in form and detail may be made therein without departing from the spirit and scope of the attached claims.

What is claimed is:
1. A semiconductor device, comprising:
a plurality of gate electrodes on a substrate,
wherein each of the plurality of gate electrodes extends in a first horizontal direction with respect to an upper surface of the substrate and the plurality of gate electrodes are spaced apart from each other in a second horizontal direction, with respect to the upper surface of the substrate, different from the first horizontal direction;
a plurality of gate contacts,
wherein each of the plurality of gate contacts is disposed on a respective one of the plurality of gate electrodes and electrically connected thereto;
a plurality of interconnect lines,
wherein each of the plurality of interconnect lines extends in the second horizontal direction and overlaps, in a vertical direction with respect to the upper surface of the substrate, at least one gate contact of the plurality of gate contacts, and wherein the plurality of interconnect lines are spaced apart from each other in the first horizontal direction;

a voltage generator configured to generate a first voltage and apply the first voltage to the plurality of gate electrodes through the plurality of gate contacts and the plurality of interconnect lines; and a dummy gate contact, which is disposed on a corresponding one gate electrode of the plurality of gate electrodes and is spaced apart, in the first horizontal direction, from a gate contact disposed on the corresponding one gate electrode, wherein the first voltage is applied to the dummy gate contact through the corresponding one gate electrode.

2. The semiconductor device of claim 1, further comprising:
a plurality of gate vias disposed on the plurality of gate contacts,
wherein each of the plurality of gate vias is interposed, in the vertical direction, between a respective gate contact of the plurality of gate contacts and a respective interconnect lines of the plurality of interconnect lines.

3. The semiconductor device of claim 1, further comprising:
a dummy gate via disposed on the dummy gate contact.

4. The semiconductor device of claim 3, further comprising:
a dummy interconnect line disposed on the dummy gate via,
wherein the dummy gate via is interposed, in the vertical direction, between the dummy interconnection line and the dummy gate contact, and
wherein the first voltage from the voltage generator is applied to the dummy interconnection line through the dummy gate contact and the dummy gate via.

5. The semiconductor device of claim 1, further comprising:
a device isolation layer, which is disposed in the substrate to define a first active region and a second active region spaced apart from each other in the first horizontal direction,
wherein the dummy gate contact overlaps in the vertical direction or is adjacent, in the first horizontal direction, to one of the first active region and the second active region.

6. The semiconductor device of claim 5,
wherein the plurality of gate electrodes are disposed to cross over the first active region and the second active region,
wherein at least one of the plurality of gate contacts is disposed between the first active region and the second active region and on the device isolation layer, and
wherein the dummy gate contact overlaps in the vertical direction or is adjacent, in the first horizontal direction, to one of the first active region and the second active region.

7. The semiconductor device of claim 5, further comprising:
an active fin, which protrudes from the substrate in the vertical direction and has a top surface higher than a top surface of the device isolation layer,
wherein the dummy gate contact overlaps the active fin.

8. A semiconductor device, comprising:
a substrate including a first active region and a second active region, which are spaced apart from each other in a first horizontal direction with respect to an upper surface of the substrate;
a first gate electrode crossing the first active region and extends in the first horizontal direction;
a second gate electrode crossing the second active region and extends in the first horizontal direction;
a gate separation pattern interposed between the first gate electrode and the second gate electrode;
a first gate contact in contact with a top surface of the first gate electrode; and
a first dummy gate contact in contact with a top surface of the second gate electrode,
wherein a first voltage is applied to the first gate contact and no voltage is applied to the first dummy gate contact.

9. The semiconductor device of claim 8, wherein the first and second gate electrodes located on a single straight line extending in the first horizontal direction.

10. The semiconductor device of claim 8, further comprising:
a gate via disposed on the first gate contact; and
a first interconnection line on the gate via.

11. The semiconductor device of claim 8, further comprising:
a device isolation layer, which is disposed in the substrate to define the first active region and the second active region,
wherein the first gate contact overlaps the device isolation layer, and the first dummy gate contact overlaps the second active region.

12. The semiconductor device of claim 8, further comprising:
a third gate electrode which is spaced apart from the first gate electrode in a second horizontal direction with respect to an upper surface of the substrate and extends in the first horizontal direction;
a second gate contact disposed on the third gate electrode; and
a second dummy gate contact spaced apart from the second gate contact and disposed on the third gate electrode.

13. The semiconductor device of claim 12, wherein a second voltage is applied to the second gate contact and the second dummy gate contact receives the second voltage through the third gate electrode.

14. The semiconductor device of claim 12, further comprising:
a second gate via disposed on the second gate contact; and
a second interconnection line disposed on the second gate via.

15. A semiconductor device, comprising:
a substrate including a first active region and a second active region, which are spaced apart from each other in a first horizontal direction with respect to an upper surface of the substrate;
a device isolation layer disposed in the substrate and defining the first and second active regions;
a first active fin and a second active fin which protrude from the substrate in a vertical direction and disposed on the first and second active regions, respectively;
a gate electrode crossing the first and second active fins in the first horizontal direction;
a plurality of first channel patterns stacked in the vertical direction on each other on the first active fin;

a plurality of second channel patterns stacked in the vertical direction on each other on the second active fin;

a gate contact in contact with a top surface of the gate electrode; and a dummy gate contact spaced apart from the gate contact and in contact with the top surface of the gate electrode, wherein the gate electrode is configured to surround each of the plurality of first and second channel patterns, and wherein the gate contact overlaps the device isolation layer and the dummy gate contact overlaps the first active fin.

16. The semiconductor device of claim 15, further comprising:

a gate insulating layer between the gate electrode and the plurality of first and second channel patterns, wherein the gate insulating layer surrounds each of the plurality of first and second channel patterns.

17. The semiconductor device of claim 15, further comprising:

a gate via on the gate contact; and an interconnection line on the gate via.

18. The semiconductor device of claim 17, wherein a voltage is applied to the gate electrode through the interconnection line and the gate contact, and wherein the dummy gate contact receives the voltage through the gate electrode.

19. The semiconductor device of claim 17, further comprising:

an interlayer insulating layer, wherein the interconnection line and the gate via are disposed in the interlayer insulating layer.

20. The semiconductor device of claim 19, wherein the interlayer insulating layer is in contact with a top surface of the dummy gate contact.

\* \* \* \* \*